(12) United States Patent
Brun et al.

(10) Patent No.: US 12,557,675 B2
(45) Date of Patent: Feb. 17, 2026

(54) INORGANIC REDISTRIBUTION LAYER ON ORGANIC SUBSTRATE IN INTEGRATED CIRCUIT PACKAGES

(71) Applicant: Intel Corporation, Santa Clara, CA (US)

(72) Inventors: Xavier Francois Brun, Hillsboro, OR (US); Sanka Ganesan, Chandler, AZ (US); Holly Sawyer, Aloha, OR (US); Timothy A. Gosselin, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1122 days.

(21) Appl. No.: 17/328,034

(22) Filed: May 24, 2021

(65) Prior Publication Data
US 2022/0375844 A1    Nov. 24, 2022

(51) Int. Cl.
*H01L 23/498* (2006.01)
*H01L 21/48* (2006.01)
*H01L 23/00* (2006.01)
*H01L 23/14* (2006.01)

(52) U.S. Cl.
CPC ...... *H01L 23/49838* (2013.01); *H01L 21/486* (2013.01); *H01L 23/145* (2013.01); *H01L 23/49827* (2013.01); *H01L 23/562* (2013.01)

(58) Field of Classification Search
CPC ............ H01L 23/49838; H01L 21/486; H01L 23/145; H01L 23/49827; H01L 23/562; H01L 23/49816; H01L 23/5385; H01L 23/49894
See application file for complete search history.

(56) References Cited

U.S. PATENT DOCUMENTS

| 10,055,631 | B1* | 8/2018 | Wen | ................ | H01L 23/49816 |
| 10,276,523 | B1 | 4/2019 | Fillion et al. | | |
| 10,600,739 | B1* | 3/2020 | Herrault | .................. | H01L 23/50 |
| 2011/0294066 | A1* | 12/2011 | Hasegawa | ............ | G03F 7/0233 |
| | | | | | 430/270.1 |

(Continued)

OTHER PUBLICATIONS

International Search Report (Year: 2022).*
(Continued)

*Primary Examiner* — Ajay Ojha
(74) *Attorney, Agent, or Firm* — Akona IP PC

(57) ABSTRACT

An integrated circuit (IC) package, comprising a die having a first set of interconnects of a first pitch, and an interposer comprising an organic substrate having a second set of interconnects of a second pitch. The interposer also includes an inorganic layer over the organic substrate. The inorganic layer comprises conductive traces electrically coupling the second set of interconnects with the first set of interconnects. The die is attached to the interposer by the first set of interconnects. In some embodiments, the interposer further comprises an embedded die. The IC package further comprises a package support having a third set of interconnects of a third pitch, and a second inorganic layer over a surface of the interposer opposite to the die. The second inorganic layer comprises conductive traces electrically coupling the third set of interconnects with the second set of interconnects.

20 Claims, 11 Drawing Sheets

(56) References Cited

U.S. PATENT DOCUMENTS

2014/0342508 A1* 11/2014 Son .................. H01L 23/49838
438/126
2021/0090984 A1    3/2021  Chun et al.
2021/0098383 A1    4/2021  Kuo et al.

OTHER PUBLICATIONS

Brun, Xavier F. et al., "Investigation of Low Street and Low Temperature SiN and SiCN PVD Films for Advanced Packaging Applications", 2021 IEEE 71st Electronic Components and Technology Conference (ECTC), pp. 2111-2117.

G. J. Scott et al., "Heterogeneous Integration Using Organic Interposer Technology," 2020 IEEE 70th Electronic Components and Technology Conference (ECTC), 2020, pp. 885-892, doi: 10.1109/ECTC32862.2020.00145.

Khanna, Vinod Kumar, "Chapter 1, Amorphous Si TFT", Flexible Electronics, vol. 2, Thin-Film transistors, IOP Publishing Ltd 2019, doi:10.1088/2053-2563/ab0d18ch1, pp. 1-1 through 1-27.

Kim, Ki Seok et al., "Silicon Nitride Deposition for Flexible Organic Electronic Devices by VHF (162 MHZ)-PECVD Using a Multi-Tile Push-Pull Plasma Source", Scientific Reports, 7:13585, DOI:10.1038/s41598-047-14122-4, Oct. 19, 2017, 7 pages.

* cited by examiner

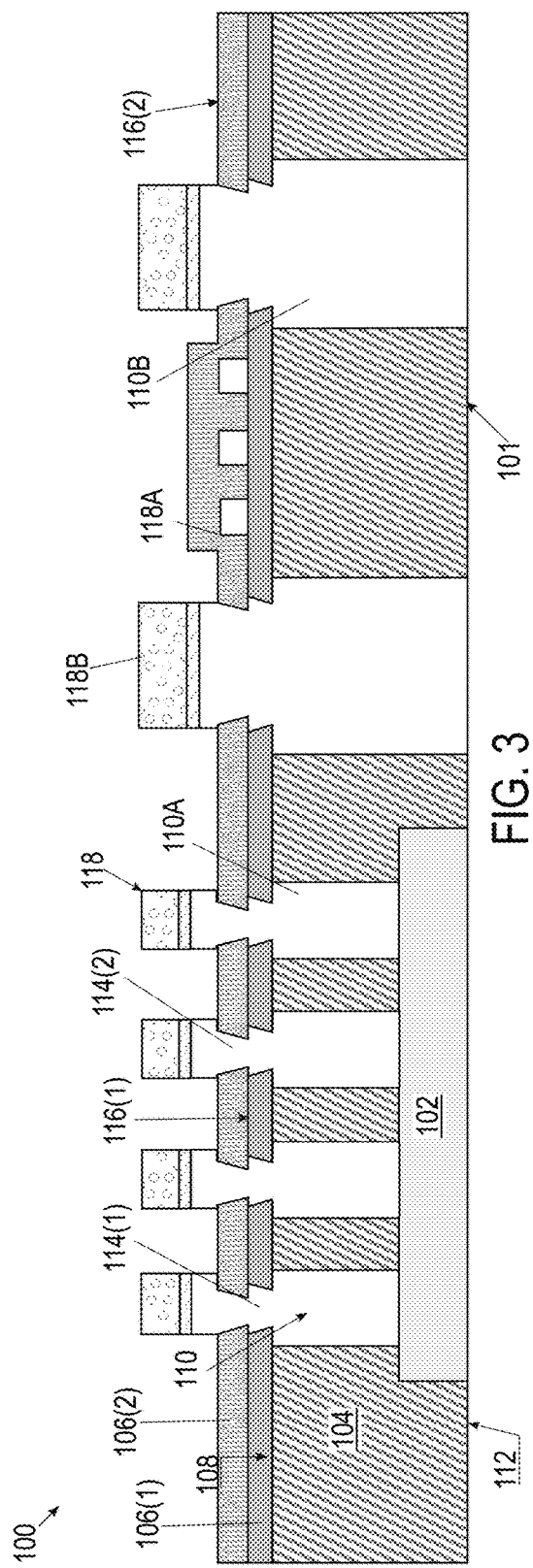
FIG. 3
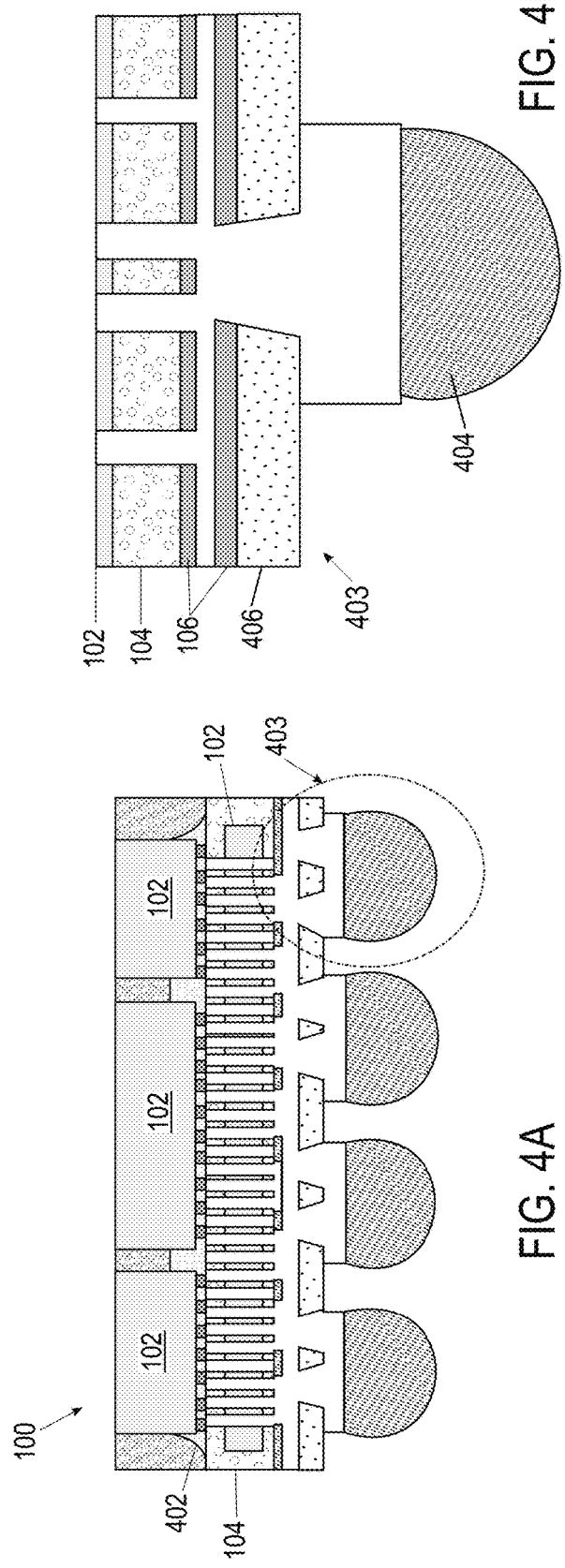
FIG. 4A
FIG. 4B

INORGANIC REDISTRIBUTION LAYER ON ORGANIC SUBSTRATE IN INTEGRATED CIRCUIT PACKAGES

TECHNICAL FIELD

The present disclosure relates to techniques, methods, and apparatus directed to inorganic redistribution layer (RDL) over organic substrates in integrated circuit (IC) packages.

BACKGROUND

Electronic circuits when fabricated on a wafer of semiconductor material, such as silicon, are commonly called ICs. The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system. Over the past few decades, shrinking of feature structures and pitches in ICs has been a driving force in the semiconductor industry, allowing for increased density of functional units on a limited base of semiconductor wafers.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 3 is a schematic cross-sectional illustration of yet another example IC package with inorganic RDL over organic substrate, according to some embodiments of the present disclosure.

FIGS. 4A and 4B are schematic cross-sectional illustrations of yet another example IC package with inorganic RDL over organic substrate, according to some embodiments of the present disclosure.

DETAILED DESCRIPTION

Overview

Figure 1:
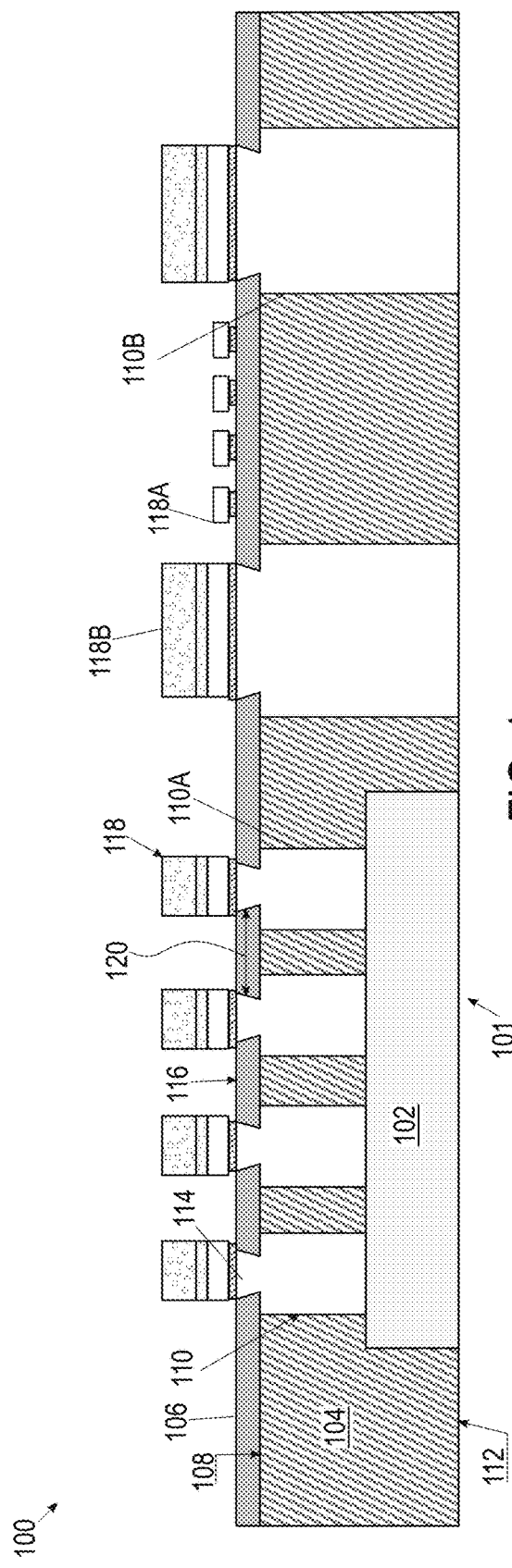
FIG. 1 is a schematic cross-sectional view of an example IC package with inorganic RDL over organic substrate, according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

In a general sense, as density of transistors grows with each new silicon processing node, the package architecture must scale accordingly. Current challenges in packaging relate to the pitch of first-level-interconnects (FLI) (e.g., interconnects between die and a package substrate) shrinking below what can be achieved with solder joints. In addition, wiring density is also a challenge, as it is a function of trace width, trace pitch and via sizes required to route from layer to layer. For example, silicon interposers using 65-nm copper back-end of line (BEOL) technology are typically routed with trace pitches of 1 micrometer to 4 micrometer, which presents a challenge for solder based interconnect technologies.

In addition, as transistors' density grows with each new silicon processing node, yielding monolithic dies becomes extremely difficult, leading to increasing adoption of die disaggregation that addresses shortcoming of pure three-dimensional stacking solutions in terms of yield, thermal management, redesigns with each silicon node, etc. The Omni Directional Interconnect (ODI) architecture with direct connection from package to dies using large copper pillars in a base complex interposer (also shortened to "base complex" or simply "interposer," used interchangeably herein) comprising one or more embedded dies within a substrate and localized embedded through-silicon via (or through-substrate via) (TSV) dies is one example of the die disaggregation scheme. In a general sense, base complex interconnects are either micro-logic bump (MLB) (also referred to herein as "micro-bumps") at base complex to top die interfaces or package side bump (PSB) at base complex to package interfaces.

However, there is a pitch mismatch between the MLBs and the PSBs on either side of the base complex, with MLB pitches being much smaller than PSB pitches. Without a RDL at the MLBs, the interconnects of the top die, embedded TSV die and copper pillars in the base complex are constrained to have a common pitch, significantly limiting top die pitches, constraining design flexibility and manufacturability. Without a RDL at the PSBs, the pitches of the base complex PSBs are constrained to match top die pitches. As base complex size grows and top die pitch shrinks, this makes attaching the base complex to a PCB or another package substrate difficult. Current solutions to the pitch mismatch have redundant MLBs, such as dummy or floating bumps.

In existing packaging architectures, the most commonly used FLI materials are copper bumps with solder caps on the die and pads on the package substrate, or gold-coated copper pads on the die with solder paste or solder balls on the package substrate. Lead-based solders with a melting point of approximately 185° C. and lead-free solders with a higher melting point of 235° C. are widely used in these architectures. However, these solder-based interconnects cannot achieve very fine pitch (e.g., less than 10 micrometer) demanded by the new silicon processing nodes.

Hybrid direct bonds, including dielectric bonds along with metal-to-metal (e.g., Cu—Cu) bonding, offers a promising solution, but faces significant integration challenges due to stringent manufacturing requirements, in particular at package levels (e.g., manufacturing of hybrid direct interconnects in a wafer level package) due to the lower temperatures needed by complementary metal-oxide-semiconductor (CMOS) processes and typical packaging materials. For example, the manufacturing process generally has to trade-off a high-yield bonding process for dielectric and metal interfaces against maintaining low processing temperatures to ensure package integrity. Many studies have demonstrated the benefit of silicon carbonitride (SiCN) dielectric compared to silicon oxide ($SiO_2$) for decreasing bonding temperature, specifically reducing the annealing temperature below or equal to 250 degrees Celsius. However, these studies have leveraged plasma enhanced chemical vapor deposition (PECVD) which requires high deposition temperature (i.e., 370 degrees Celsius) and precursors.

In addition, these films necessitate pre-bonding densification above deposition temperature to prevent voiding at the bonding interface. Physical vapor deposition (PVD) is a superior method for silicon nitride (SiN) dielectric deposition for bonding with low deposition temperature. The PVD process does not require densification pre bonding and can achieve comparable bond strength with low post-bonding annealing temperature. However, the SiN layers are typically formed over inorganic dielectric materials used in monolithic semiconductor processes back-end-of-line (BEOL), such as oxides of silicon and like materials, which are not used in packaging materials on in package-level manufacturing flows.

Another solution is to use a RDL on the die which can accommodate differing line pitches between the die and the package substrate. In general, a redistribution layer is used to re-route contact points from the surface of the die or package substrate to different layers, which in turn allows higher contact density and differential pitches between the layers. For example, the RDL is typically disposed over the die to achieve a finer pitch on the interface with the die and a coarser pitch on the interface with the package substrate and/or solder balls. In such arrangements, the RDL is typically an organic material compatible with the underlying dielectric (e.g., SiN and $SiO_2$) of the die. In some packages in which the RDL is disposed on the package substrate (e.g., thin film on mold compound), the RDL is an organic material compatible with the underlying organic dielectric of the package substrate. For example, WPR® (registered trademark of JSR Corporation, Tokyo, Japan), a typical photosensitive dielectric material used to form RDLs, and also used as overcoat layers for wafer-level chip scale packages (WL-CSPs) and organic passivation layers for semiconductor devices, has low cure temperature (≤200 degrees Celsius) with excellent adhesion to silicon nitride and silicon oxides and low residual stress. However, it cannot support RDL thickness of less than 5 micrometer and corresponding feature sizes and pitches.

In addition, viable manufacturing processes to generate feature sizes of sub-5 micron pitch in organic RDL layers is an ongoing challenge that has not been solved satisfactorily. For example, laser ablation to remove organic dielectric materials from a surface can provide feature sizes less than 5 microns; however, the process is dirty and slow. Another approach is to use stenciled organic thin film on mold compound; however, the technology is still in its early stages. In yet another method, ultra fine-pitch organic substrate (uFOS) achieves line width/line space down to 2 microns but requires multiple redistribution layers. Besides, such high-density fan-out (HDFO) organic interposers are best suited to applications requiring trace pitch of 3 micrometer to 10 micrometer, which is higher than trace pitches of some silicon processing nodes and therefore, less desirable for such nodes.

In contrast to organic RDL layers, inorganic passivation layers used in semiconductor manufacturing to provide a protective barrier for active semiconductor surfaces from the surrounding environment are thin enough to permit vias and features with very low pitch. Passivation layers made of silicon nitride and similar materials used in semiconductor manufacturing typically have good adhesion to the underlying silicon, and are chemically inert, corrosion resistant dielectrics providing a diffusion barrier to water. They can be formed with thickness less than 100 nanometer if desired, and are fabricated by means of several known techniques, including atomic layer deposition (ALD), spin-coating, electro-chemical deposition, sputtering, electron beam evaporation, floating transfer, and dip-casting. In some typical semiconductor manufacturing flows, the passivation layers are formed with deposition of a silicon oxide layer and a silicon nitride layer over the semiconductor substrate using PECVD. A capping layer is another kind of barrier layer formed generally on the upper surfaces of interconnects. Silicon nitride, silicon carbide, silicon carbonitride and silicon oxycarbide are typically used as capping layers for interconnects because these materials serve as a barrier against copper diffusion, and as an etch stop for any subsequent dual damascene etch processes.

In contrast to such inorganic passivation layers over inorganic substrates such as silicon, various embodiments of the present disclosure comprise an inorganic passivation layer over an organic substrate such as epoxy. In a general sense, thin film passivation using thin silicon nitride ($Si_3N_4$) film on flexible plastic substrates such as polyethylene terephthalate (PET), polyethylene naphthalate (PEN), and polyethersulfone (PES) is a known technique for effective diffusion barriers. These thin inorganic layers over plastic substrates do not function in any RDL capacity, however. Besides, depositing silicon nitride film with high density, good uniformity, and good adhesion on flexible plastic substrates is challenging at low temperatures. Embodiments of the present disclosure differ from such thin films over flexible plastic substrates in the nature of the underlying substrate (e.g., epoxy-based, or mold-like as opposed to PET based), the process used to deposit such inorganic layer (e.g., low temperature) and the function of the inorganic layer (e.g., RDL as opposed to merely protective barrier in flexible PET applications).

In one aspect of the present disclosure, an example of an interposer includes a substrate comprised of an organic insulator, and an inorganic layer over the organic insulator. As used herein, the term "interposer" refers to a structure comprising a substrate having electrical pathways therein to route electrical energy (e.g., power, ground, and/or signals) from one surface to an opposing surface. In some embodiments, the interposer may be coupled to one or more dies on one surface and a package support on an opposing surface. In other embodiments, the interposer may be coupled to one or more dies on one surface, and to one or more dies on the opposing surface. In yet other embodiments, the interposer may be coupled to one or more dies on one surface and to a printed circuit board (PCB) on the opposing surface. In yet other embodiments, many such interposers may be stacked one on top of another. In some embodiments, the interposer further comprises a die embedded therein. Although interposers in general can comprise organic materials (e.g., silica filled epoxy) and inorganic materials (e.g., ceramic), embodiments described herein refer to substrates comprising organic insulators. The organic insulator has interconnects therein of a first pitch and the inorganic layer has interconnects therein of a second pitch, which is less than the first pitch.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The term "interconnect" may be used to describe any element formed of an electrically conductive material for providing electrical connectivity to one or more components associated with an IC or/and between various such components. In general, the "interconnect" may refer to both conductive traces (also sometimes referred to as "lines") and conductive vias. In general, in context of interconnects, the term "conductive trace" may be used to describe an electrically conductive element isolated by an insulator material (e.g., a low-k dielectric material) that is provided within the plane of an IC die. Such traces are typically stacked into several levels, or several layers, of metallization stacks. On the other hand, the term "via" may be used to describe an electrically conductive element that interconnects two or more traces of different levels. To that end, a via may be provided substantially perpendicularly to the plane of an IC die and may interconnect two traces in adjacent levels or two traces in not adjacent levels. A term "metallization stack" may be used to refer to a stack of one or more interconnects for providing connectivity to different circuit components of an IC chip. Sometimes, traces and vias may be referred to as "conductive traces" and "conductive vias", respectively, to highlight the fact that these elements include electrically conductive materials such as metals.

Interconnects as described herein, in particular interconnects of the IC structures as described herein, may be used for providing electrical connectivity to one or more components associated with an IC or/and between various such components, where, in various embodiments, components associated with an IC may include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer. In another example, the terms "package" and "IC package" are synonymous, as are the terms "die" and "IC die," the term "insulating" means "electrically insulating," the term "conducting" means "electrically conducting," unless otherwise specified.

In yet another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic cross-sectional illustration of an IC package 100, according to some embodiments of the present disclosure. An interposer 101 comprises a die 102 is embedded within a substrate 104 comprising an organic insulator. An inorganic layer 106 is located on a surface 108 of substrate 104. In an example embodiment, inorganic layer 106 comprises a nitride of silicon (e.g., $Si_xN_y$). In other embodiments, inorganic layer 106 may comprise silicon, carbon, and nitrogen (e.g., SiCN), or silicon and oxygen (e.g., $SiO_2$). Substrate 104 may comprise any suitable organic material, including epoxy molding compounds (EMCs), epoxy resins, silica filled epoxies, polyimide, polyester, vinyl polyester, silica or fiberglass filled with various additives such as bismaleimides and anti-bleeds.

Through-connections 110 in substrate 104 provide electrical coupling from die 102 to surface 108 of substrate 104, or between surface 108 and an opposing surface 112. For example, through-connections 110A provide coupling from die 102 to surface 108, and through-connections 110B provide electrical coupling between surfaces 108 and 112. In some embodiments, through-connections 110B may be termed as through-mold vias (TMVs). Vias 114 within inorganic layer 106 provides electrical coupling for through-connections 110 to a surface 116 of inorganic layer 106. In various embodiments, conductive traces 118 comprised of one or more layers of metals may be disposed on surface 116. For example, conductive trace 118A comprises a single layer of metal; conductive trace 118B comprises three layers of metals. Any number of metal layers may be comprised in conductive traces 118 within the scope of the present disclosure. Any of conductive traces 118, vias 114 and/or through-connections 110 may be formed of any appropriate conductive material, such as copper, silver, nickel, gold, aluminum, or other metals or alloys, for example. Conductive traces 118, vias 114, and through-connections 110 may provide electrical coupling to die 102 or to surface 112, for example, providing power, ground, and signal connections thereto. In various embodiments, conductive traces 118 may be interconnected appropriately to route power, ground and/or signals to/from various components of IC package 100. In some embodiments, conductive traces 118 may comprise bond pads for electrical coupling with solder balls or other interconnects.

In various embodiments, a minimum pitch 120 between vias 114 in inorganic passivation layer 106 may facilitate die-to-die (DTD) interconnection within IC package 100. In some embodiments, minimum pitch 120 may be 1 micron or smaller. In other embodiments, minimum pitch 120 may be less than 10 micron, for example, to support DTD interconnects. In yet other embodiments, minimum pitch 120 may be 100 microns or larger, for example, to support die-to-package substrate (DTPS) interconnects. In some embodiments, the DTPS interconnects disclosed herein may have a pitch between about 80 micrometer and 300 micrometer, while the DTD interconnects disclosed herein may have a pitch between about 0.7 micrometer and 100 micrometer, all of which may be supported by inorganic layer 106. In contrast to organic redistribution or passivation layers, inorganic layer 106 in various embodiments can support any pitch that is manufacturable using known semiconductor processing technologies. For example, any manufacturing technique that can dispose a layer of silicon nitride over silicon may be used to dispose inorganic layer 106 over substrate 104 comprising an organic dielectric. In various embodiments, pitch 120 may be scalable to meet any desired interconnect density, constrained only by manufacturing limitations in general of silicon processing nodes.

In some embodiments, inorganic layer 106 may function as a single layer RDL. Such an application can provide design flexibility, allowing separation of top die interconnects or substrate interconnects from embedded die interconnects through suitable rerouting of traces. The RDL can reduce any unused area created as a result of embedding die 102 in substrate 104 (for example, keep-off zones near through-connections 110B) to enable additional routing for top die connection. In addition, inorganic layer 106 overcomes the disadvantages of organic RDL, such as organic photo-definable dielectrics including polyimide (PI), polybenz-oxazoles (PBO) and WPR® that cannot support very fine pitches. In some embodiments, an organic passivation and/or RDL layer (not shown) may be added on top of inorganic layer 106, for example, to provide further redistribution.

The single layer RDL can also enable extending the architecture of IC package 100 by loosening pitches on surface 112 to enable coupling with components thereon having coarser pitch. In embodiments in which die 102 is placed on a mold shelf or cavity inside substrate 104 (e.g., at a controlled height, for example, using thermal compression bonding (TCB)), thereby creating an unrouteable area under the mold shelf, inorganic layer 106 disposed on surface 112 (not shown) can function as an RDL layer, fanning out interconnects to this area appropriately. In some embodiments, inorganic layer 106 may additionally function as a passivation and/or barrier layer, for example, preventing electromigration risk and dendrite formation in solder-based interconnects, and functioning as a hermetic seal to keep out moisture. In some embodiments, inorganic layer 106 provides a "resetting" of surface 108 by providing additional and new areas for rerouting using vias 114. In some embodiments, the arrangement as shown in the figure may be used in advanced packaging architectures, such as Omni-Directional Interconnects (ODI) and similar technologies.

In some embodiments, die 102 may comprise a substrate that is formed of substantially monocrystalline semiconductors, such as silicon or germanium. In some other embodiments, the substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In yet other embodiments, the substrate may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the substrate may comprise an intrinsic IV or III-V semiconductor material or alloy, not intentionally doped with any electrically active impurity; in alternate embodiments, nominal impurity dopant levels may be present. In still other embodiments, the substrate may comprise be organic materials such as silica-filled epoxy. In other embodiments, the substrate may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the substrate may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc.

In various embodiments, die 102 may include, or be a part of, one or more of an interconnect bridge, a central processing unit, a memory device, e.g., a high-bandwidth memory device, a logic circuit, input/output circuitry, a transceiver such as a field programmable gate array transceiver, a gate array logic such as a field programmable gate array logic, of a power delivery circuitry, a III-V or a III-N device such as a III-N or III-N amplifier (e.g., GaN amplifier), Peripheral Component Interconnect Express circuitry, Double Data Rate transfer circuitry, or other electronic components known in the art. In some embodiments, die 102 may comprise active circuitry; in other embodiments, die 102 may comprise only passive circuitry without any active components. In some embodiments, die 102 may comprise TSVs; in other embodiments, die 102 may not have TSVs.

Note that FIG. 1 is intended to show relative arrangements of the components within their assemblies, and that, in general, such assemblies may include other components that are not illustrated (e.g., various interfacial layers or various other components related to optical functionality if applicable, electrical connectivity, or thermal mitigation). For example, in some further embodiments, the assembly as shown in FIG. 1 may include more dies along with other electrical components. Additionally, although some components of the assemblies are illustrated in FIG. 1 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

Figure 2:
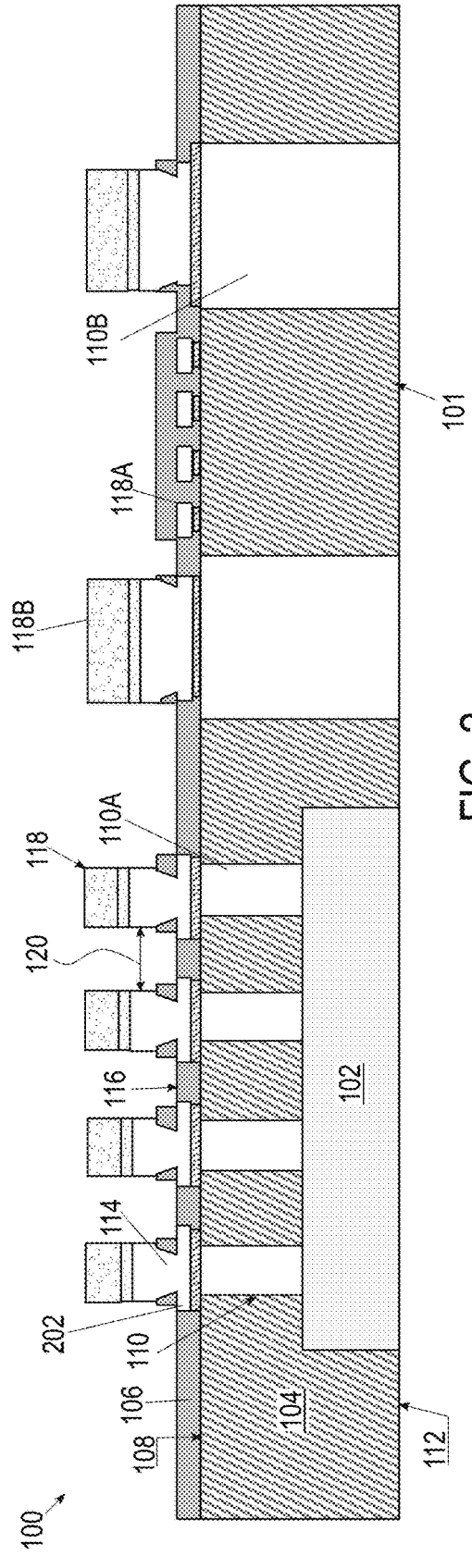
FIG. 2 is a schematic cross-sectional illustration of another example IC package with inorganic RDL over organic substrate, according to some embodiments of the present disclosure.

FIG. 2 is a schematic cross-sectional illustration of IC package 100, according to some embodiments of the present disclosure. Interposer 101 comprises bond pads 202 on surface 108, for example, aligned with through connections 110. At least some conductive traces 118, for example, 118A may also be formed on surface 108 of substrate 104 rather than on surface 116 of inorganic layer 106. In some embodiments, inorganic layer 106 provides a "resetting" of surface 108 by providing additional and new areas for rerouting using bond pads 202 and conductive traces 118A. Inorganic layer 106 functions as a capping layer in some embodiments, for example, serving to protect conductive traces 118A from surrounding environment. In some embodiments, an organic passivation and/or RDL layer (not shown) may be added on top of inorganic layer 106.

FIG. 3 is a schematic cross-sectional illustration of IC package 100, according to some embodiments of the present disclosure. Interposer 101 comprises a first inorganic layer 106(1) over surface 108 of substrate 104. Vias 114(1)

between surface 116(1) of inorganic layer 106(1) and surface 108 of substrate 104 provide electrical coupling for through-connections 110 in substrate 104. A second inorganic layer 106(2) may be on surface 116(1) of inorganic layer 106(1). Conductive traces 118 may be on surface 116(2) of inorganic layer 106(2). Vias 114(2) in inorganic layer 106(2) may provide electrical coupling for vias 114(1) and through-connections 110 to conductive traces 118. Inorganic layer 106, comprising layers 106(1) and 106(2) may serve as a one-layer RDL and additional capping layer in such embodiments. In some embodiments, an organic passivation and/or RDL layer (not shown) may be added on top of inorganic layer 106.

FIG. 4A is a schematic cross-sectional illustration of IC package 100 according to some embodiments of the present disclosure. A plurality of dies 102 may be stacked and/or otherwise arranged in IC package 100 over interposer 101 comprising substrate 104 and one or more dies 102 embedded therein. In some embodiments, an underfill 402 between top dies 102 and substrate 104 may provide additional thermo-mechanical support for top dies 102. In some embodiments, an organic mold layer may be formed around one or more dies 102 to form a reconstituted wafer (e.g., embedded wafer level ball grid array (e-WLB)) or a reconstituted panel (e.g., embedded panel level ball grid array (e-PLB)), which is singulated to form interposer 101. An inorganic RDL may then be disposed over the surface of the mold layer to allow interconnects to the terminals to fan-out beyond the edges of such embedded dies.

A portion 403 is expanded in greater detail in FIG. 4B for ease of explanation. An interconnect, such as a solder-based interconnect 404 may be on the bottom of IC package 100. Die 102 closest to solder interconnect 404 may be inside a substrate 104 in some embodiments; in other embodiments, a layer of organic material, comprising epoxy-based mold-like material may be disposed on die 102, forming substrate 104 for purposes of the present disclosure. Inorganic layer 106 may be disposed on substrate 104 suitably. For example, a first inorganic layer may be disposed, followed by forming metallization and vias thereon, followed by a second inorganic layer. An organic polyimide RDL 406 may be additionally disposed on inorganic layer 106, for example, as additional RDL. Organic polyimide RDL 406 may comprise another set of conductive traces having a different pitch than the conductive traces in inorganic layer 106. In various embodiments, the arrangement as depicted in FIGS. 4A and 4B may be used in high-performance three-dimensional IC face-to-face based packaging architectures, such as Foveros™, with extremely fine-pitched (e.g., 36 micrometer) micro-bump-based DTD interconnects at die-to-die interfaces. With inorganic layer 106 as described herein, the extremely fine pitches at die-to-die interfaces may be replicated at package level, for example, between substrate 104 and a package substrate or PCB replacing solder-based interconnects 404 with DTD interconnects such as micro-bumps, allowing stacking and reduced footprint, and/or higher performance.

Figure 5A:
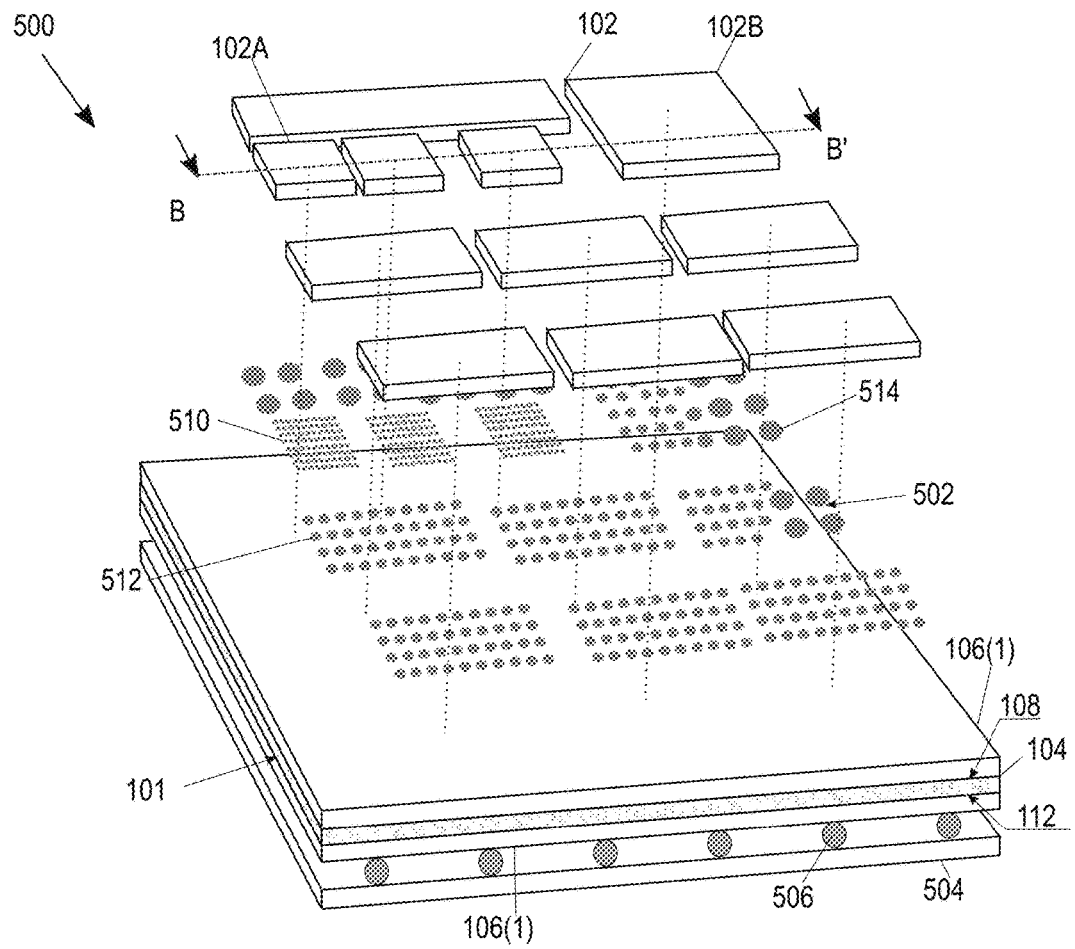
FIG. 5A is a schematic exploded oblique view of IC package with inorganic RDL over organic substrate, according to some embodiments of the present disclosure.

FIG. 5A is a simplified exploded oblique projection of an example IC package 100 according to some embodiments of the present disclosure. A plurality of dies 102 (for example, 102A and 102B among others) may be coupled to interposer 101 with DTD interconnects 502. Interposer 101 comprises substrate 104 and inorganic layer 106 disposed on at least one surface 108 of substrate 104 proximate to and facing the plurality of dies 102. In some embodiments, inorganic layer 106 may be disposed on opposing surface 112. In some embodiments (e.g., as shown), inorganic layer 106 may be disposed on both surface 108 and surface 112, identified as 106(1) and 106(2) respectively. Interposer 101 may be coupled to a PCB 504 with DTPS interconnects 506 proximate to surface 112 opposite to dies 102. In some embodiments, DTPS interconnects 506 may have a coarser pitch than DTD interconnects 502.

In some embodiments, interposer 101 may be coupled to another interposer 101 instead of to PCB 504. In such embodiments, DTPS interconnects 506 may be replaced with DTD interconnects 502 suitably. In other such embodiments, DTPS interconnects 506 may be used to couple the two interposers together. In some other embodiments, another plurality of dies 102 may be coupled to substrate 104 on surface 112 instead of PCB 504. In such embodiments, DTPS interconnects 506 may be replaced with DTD interconnects 502 suitably. Any such combination is possible within the broad scope of the present disclosure.

Inorganic layer 106 may function as a RDL on surface 108, accommodating varying pitches of DTD interconnects 502, including extremely fine pitch, for example, hybrid direct bonds 510 with minimum pitch less than 10 micrometer; very fine pitch, for example, micro-bumps 512 with minimum pitch between 20 and 80 micrometer; and fine pitch, for example, flip-chips 514 with minimum pitch around 100 micrometer. Likewise, inorganic layer 106 may function as another RDL on surface 112, accommodating varying pitches of DTPS interconnects 506.

Figure 5B:
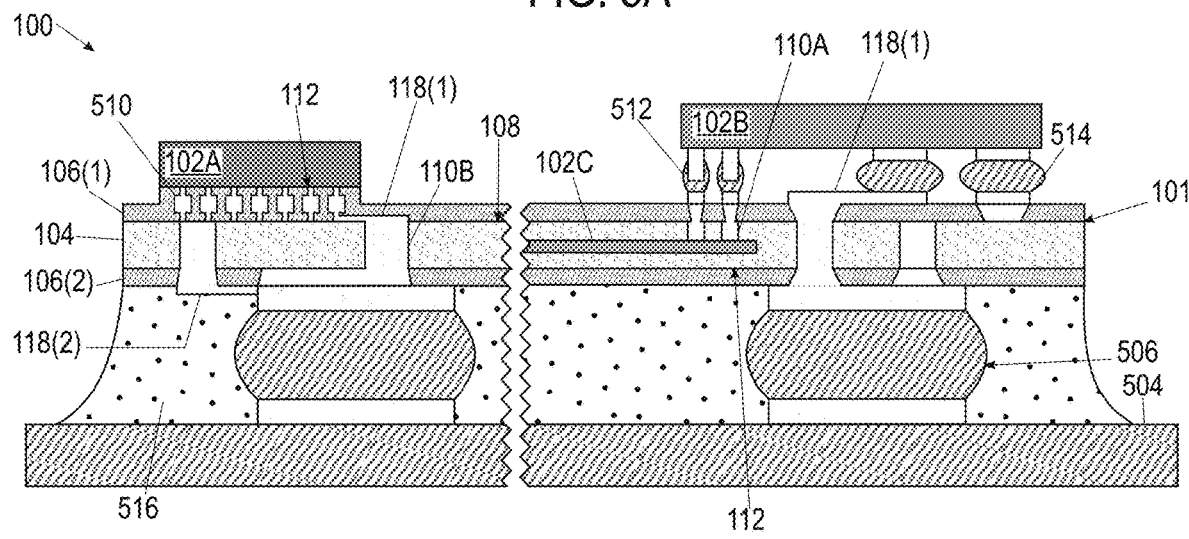
FIG. 5B is a schematic cross-sectional view of a portion of the IC package of FIG. 5A according to some embodiments of the present disclosure.

A simplified cross-sectional illustration of the IC package 100 of FIG. 5A along section BB' is shown in FIG. 5B for further explanation. For ease of illustration and so as not to clutter the drawings, only a few components shown in FIG. 5A are illustrated in FIG. 5B. The components selected are merely for purposes of illustration/explanation and are not intended to limit the scope of the embodiments described herein.

In some embodiments, die 102A may be coupled to substrate 104 with hybrid direct bonds 510. Conductive trace 118(1) on surface 108 of substrate 104 may electrically couple DTD interconnects 502 (e.g., hybrid direct bonds 510) with interconnects comprising through-connections 110 (e.g., 110B) in substrate 104. Suitable vias disposed in inorganic layer 106(1) may also enable electrical coupling between DTD interconnects 502 (e.g., hybrid direct bonds 510), conductive trace 118(1) and/or through-connections 110 (e.g., 110B). Hybrid direct bonds 510 may have a finer pitch than through-connections 110 in some embodiments. Redistributive conductive trace 118(1) may enable fanning out from coarser pitch interconnects (e.g., 110) to finer pitch interconnects (e.g., 510) in a single layer RDL comprising inorganic layer 106(1).

Conductive trace 118(2) on surface 112 may likewise provide electrical coupling between through-connections 110 (e.g., 110B) and DTPS interconnects 506. Suitable vias disposed in inorganic layer 106(2) may also enable electrical coupling between DTPS interconnects 506, conductive trace 118(2), and/or through-connections 110 (e.g., 110B). Hybrid direct bonds 510 may have a finer pitch than through-connections 110 in some embodiments. Redistributive conductive trace 118(2) may enable fanning out from coarser pitch interconnects (e.g., 506) to finer pitch interconnects (e.g., 110) in a single layer RDL comprising inorganic layer 106(2).

In the embodiment shown in the figure, die 102B may be coupled to interposer 101 with micro-bumps 512 and flip-chips 514. Interposer 101 may comprise an embedded die 102C within substrate 104. In some embodiments, die 102C may function as a bridge die, interconnecting die 102B with neighboring dies. In other embodiments, die 102C may function as a base die, for example, providing various IC functionalities used by one or more of the plurality of dies 102 on substrate 104. Conductive trace 118(1) on surface 108 of substrate 104 may electrically couple DTD interconnects 502 (e.g., micro-bumps 512 and flip-chips 514) with interconnects comprising through-connections 110 (e.g., 110A, 110B) in substrate 104, providing electrical coupling between dies 102B and 102C and other components of IC package 100. Suitable vias disposed in inorganic layer 106(1) may also enable electrical coupling between micro-bumps 512 and flip-chips 514 and conductive trace 118(1) and/or through-connections 110 (e.g., 110A, 110B).

When DTD or DTPS interconnects (e.g., 502, 506) are described at an interface, a first surface of the interface may include a first set of conductive contacts, and the second surface may include a second set of conductive contacts. One or more conductive contacts of the first set may then be electrically and mechanically coupled to some of the conductive contacts of the second set by the DTD or DTPS interconnects. In some embodiments, DTD interconnects 502 may be used as data transfer lanes, while DTPS interconnects 506 may be used for power and ground lines, among others.

In various embodiments, DTD interconnects 502 disclosed herein may take any suitable form, including micro-bumps, direct bond interconnects (DBI), hybrid direct bonds, and flip-chips, among others. In some embodiments, the conductive contacts on either side of the DTD interconnect may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid direct bonding, a dielectric material (e.g., silicon oxide, silicon nitride, silicon carbide, or an organic layer) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, dies on either side of a set of DTD interconnects 502 may be unpackaged dies, and/or DTD interconnects 502 may include small conductive bumps or pillars (e.g., copper bumps or pillars) attached to the respective conductive contacts by solder. In some embodiments, some or all of DTD interconnects 502 may be solder interconnects that include a solder with a higher melting point than a solder included in some or all of DTPS interconnects 506. For example, when DTD interconnects 502 are formed before DTPS interconnects 506 are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

DTPS interconnects 506 disclosed herein may take any suitable form. In some embodiments, a set of DTPS interconnects 506 may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression. In some embodiments, a set of DTD interconnects may also include any appropriate solder material, such as any of the materials discussed above for the DTPS interconnects. In some embodiments, a set of DTD interconnects may include an anisotropic conductive material, such as any of the materials discussed above for the DTPS interconnects.

In some embodiments, the pitch of DTD interconnects 502 may be different from the pitch of DTPS interconnects 506, although, in other embodiments, these pitches may be substantially the same. In packages as described herein, some or all of DTD interconnects 502 may have a finer pitch than DTPS interconnects 506. In some embodiments, where DTD interconnects 502 may have too fine a pitch to couple to substrate 104 directly, inorganic layer 106 may serve to enable such coupling by providing surface 116 and suitable material in which fine pitch vias may be formed with as fine as pitch as on die 102.

In general, the DTD interconnects may have a smaller pitch than the DTPS interconnects due to the greater similarity of materials in the different dies on either side of a set of DTD interconnects than between a die and a package support on either side of a set of DTPS interconnects. The differences in material composition of dies and package supports may result in differential expansion and contraction of the dies and package supports due to heat generated during operation (as well as the heat applied during various manufacturing operations). To mitigate damage caused by this differential expansion and contraction (e.g., cracking, solder bridging, etc.), the DTPS interconnects are typically larger and farther apart than DTD interconnects, which may experience less thermal stress due to the greater material similarity of the pair of dies on either side of the DTD interconnects.

On the other hand, in various embodiments, inorganic layer 106 on either side of DTD interconnects 502 (e.g., on die-side and interposer-side) may enable the same surface material on both sides because dies 102 are also typically coated with a passivation layer of silicon nitride or similar inorganic material. This material symmetry may enable reducing differential stresses and facilitating finer pitch interconnects between die 102 and organic dielectric-based substrate 104 than is possible without inorganic layer 106 on substrate 104. Inorganic layer 106 may further enable any suitable via pitch on surfaces 108 and/or 112, so that any pitch constraints on DTD interconnects 502 and DTPS interconnects 506 arise from the limitations of die 102 and PCB 504 respectively rather than of substrate 104. In some embodiments, an underfill 516 between interposer 101 and PCB 504 may serve to provide additional thermo-mechanical integrity and reliability to IC package 100.

Figure 6A:
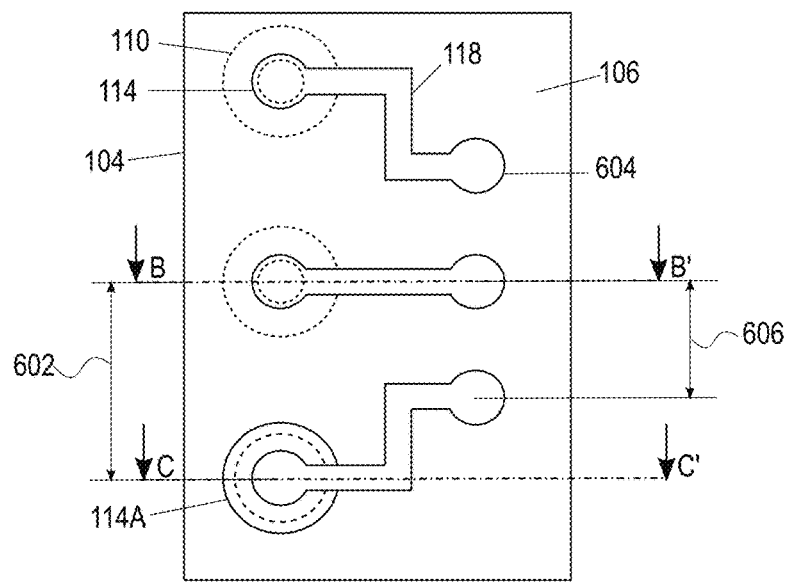
FIG. 6A is a schematic top view of an example surface of an IC package according to some embodiments of the present disclosure.

FIG. 6A is a simplified top view of a portion of an IC package 100 according to an example embodiment. Inorganic layer 106 may be over substrate 104 comprising an organic insulator. Substrate 104 may include interconnects comprising through-connections 110 at a minimum pitch 602. Interconnects comprising pads 604 may be formed on inorganic layer 106 at minimum pitch 606. In various embodiments, pitch 606 may be less than pitch 602. Additional interconnects comprising conductive traces 118 may electrically couple vias 114 over through-connections 110 with pads 604 to enable fanning out from a fine pitch (e.g., 606) of pads 604 on inorganic layer 106 to a coarser pitch (e.g., 602) of through-connections 110 in substrate 104.

Features may be formed with any desired sizes, shapes and pitches that can be accommodated by inorganic layer 106. For example, via 114A may have a similar diameter as (or be larger/smaller than) through-connection 110 in substrate 104. Thus, inorganic layer 106 enables a one-layer RDL. In various embodiments, pads 604 with fine pitch 606 may be used to form fine pitch interconnects, such as hybrid direct bonds with dies. In other embodiments, pitch 606 between pads 604 may be larger than pitch 602 between through-connections 110 (or vias 114), for example, to enable electrical coupling with a package substrate or PCB having coarser pitch interconnections, such as ball grid array (BGA). In some embodiments, a coplanar die/mold interfaces, for example, on surface 108 of substrate 104 may enable lower stresses on conductive trace 118 routed on surface 108. Direct plating on small die pads (e.g., 602) on surface 108 may enable a high interconnect density in embodiments with inorganic layer 106 over substrate 104.

Figure 6B:
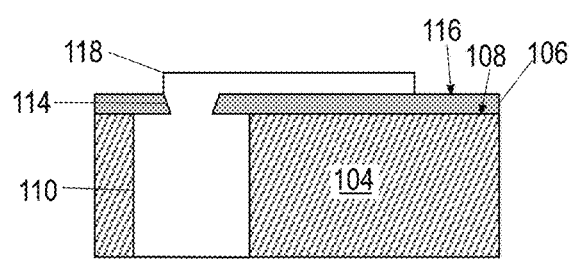
FIGS. 6B and 6C are schematic cross-sectional views of a portion of the IC package of FIG. 6A, according to some embodiments of the present disclosure.

FIG. 6B is a simplified cross-sectional view of FIG. 6A along section BB' that shows the electrical coupling between through-connection 110, via 114, conductive trace 118 and pad 604 (which is not clearly discernable in the cross-section, because it connects substantially seamlessly to conductive trace 118). Via 114 may be disposed over surface 108 of substrate 104; conductive trace 118 may be disposed over surface 116 of inorganic layer 106, in a manner similar to the embodiment shown in FIG. 1. Other embodiments may comprise similar fanning out from fine pitch pads to coarse pitch vias and vice versa in structures similar to those shown in FIG. 2 or FIG. 3.

Figure 6C:
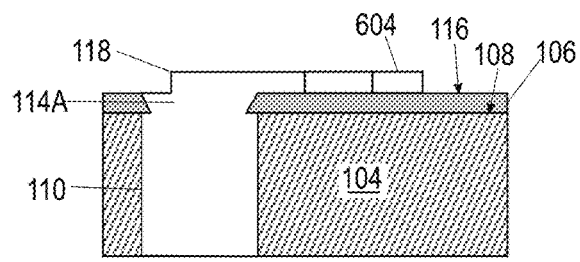

FIG. 6C is a simplified cross-sectional view of FIG. 6A along section CC' that shows the electrical coupling between through-connection 110, via 114A, conductive trace 118 and pad 604. Via 114A may be disposed over surface 108 of substrate 104 and have similar size and shape as through-connection 110. In some embodiments, via 114A may comprise a bond pad (e.g., 202 of FIG. 2) on through-connection 110. Conductive trace 118 may be disposed over surface 116 of inorganic layer 106, in a manner similar to the embodiment shown in FIG. 1. Other embodiments may comprise similar fanning out from fine pitch pads to coarse pitch vias and vice versa in structures similar to those shown in FIG. 2 or FIG. 3.

Figures 7A, 7B:
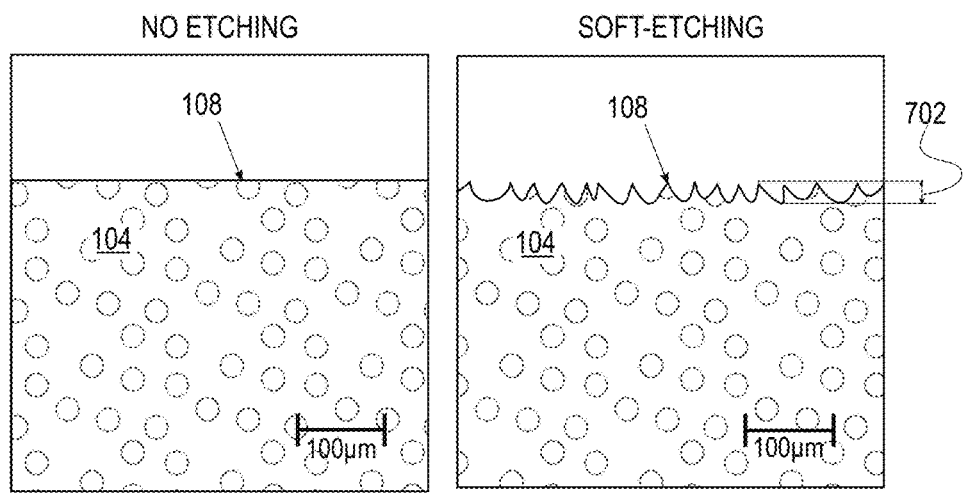
FIGS. 7A and 7B are schematic cross-sectional views of a surface in an example IC packaging architecture, according to some embodiments of the present disclosure.

FIGS. 7A and 7B are schematic cross-sectional views of a surface in an example IC packaging architecture, according to some embodiments of the present disclosure. FIG. 7A shows surface 108 of substrate 104 polished such that its surface roughness is low. FIG. 7A shows surface 108 of substrate 104 after subjecting to a soft-etching process, such that it develops a certain surface roughness. In advanced packaging applications, it is a common practice to pre-treat a substrate, such as substrate 104 before organic thin film deposition, in a sequence of degas and soft-etching processes. Degas is primarily applied to eliminate surface moisture from the organic films and substrates by heating the substrate typically up to 120 degrees Celsius to 150 degrees Celsius. The subsequent soft-etching takes place in a dedicated chamber, such as an Inductively Coupled Plasma (ICP) module. The bombardment of the substrate by low-energy and high-density argon plasma efficiently eliminates surface contamination and native oxides, thereby enhancing adhesion of the subsequent thin film. Soft-etching using ICP etching process can deliver high etch rates, high selectivity and low damage processing with excellent profile control with low pressured plasma. In ICP plasma process, gases such as argon and nitrogen are introduced above an inductive coil, placed around a ceramic tube. The substrate, comprising the wafer, is placed on a radio frequency (RF) powered chuck. RF pulse is applied to both the coil and chuck to create a plasma. The wafer takes on potential which accelerates etching species extracted from plasma toward the surface to be etched. Introducing different gases can create a chemical reaction, resulting in anisotropic etch profiles.

While typical packaging applications employ soft-etching without considering any particular target surface roughness of surface 108, embodiments of the present disclosure use a controlled soft-etching process that delivers a regulated surface roughness measure 702 over surface 108. In a general sense, surface roughness is a series of microscopic "peaks and valleys" across the surface such as surface 108. Surface roughness is typically calculated using the root mean square (RMS) of surface peaks and valleys across the surface. In some embodiments, surface roughness measure 702 may comprise RMS (also referred to as Rq) values. In other embodiments, surface roughness measure 702 may comprise average roughness (also referred to as Ra) values. In various embodiments, surface roughness measure 702 of surface 108 after the soft-etching process may be 0.4 nm more than the corresponding surface roughness measure before the soft etch process.

Further, surface roughness measure 702 may vary with the type of material of substrate 104. In an example embodiment, surface roughness measure 702 of a granular mold material with no soft etch was 3.1 nm, whereas surface roughness measure 702 of the same material after the soft etch was 3.4 nm. In another example embodiment, surface roughness measure 702 of a liquid mold material after curing with no soft-etching process was 3.3 nm, whereas surface roughness measure 702 of the same material after the soft-etching was 4.0 nm. In various embodiments, subjecting substrate 104 to the soft-etching process to increase the surface roughness by a small amount (e.g., approximately 10%) enables better adhesion of inorganic layer 106 to substrate 104 (as compared with no etching) with resulting improved reliability, for example, without delamination or cracks after 168 hours at 60 degrees Celsius and 60% humidity with 10 reflow cycles at 260 degrees Celsius; after 216 hours at 30 degrees Celsius and 60% humidity with 3 reflow cycles at 260 degrees Celsius; and 1000 hours at 150 degrees Celsius.

Figure 8:
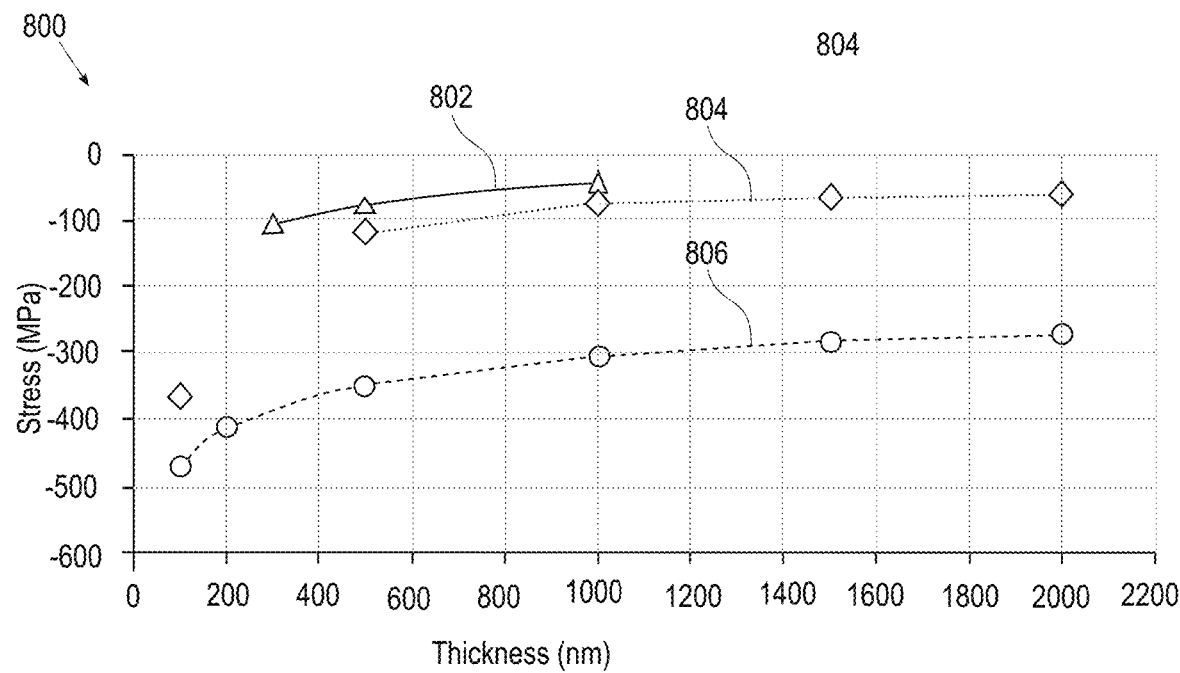
FIG. 8 is a graph representing film stress as a function of inorganic layer thickness according to some embodiments of the present disclosure.

FIG. 8 is a graph 800 representing film stress as a function of inorganic layer thickness according to some embodiments of the present disclosure. Residual film stress may be calculated using Stoney's formula:

$$\sigma = \frac{E_s}{6(1-\vartheta_S)} \cdot \frac{t_s^2}{t_f} \left[ \frac{1}{R_1} - \frac{1}{R_0} \right]$$

where $E_s/(1-\vartheta_s)$ is the biaxial Young's modulus of the substrate (180.5 GPa for (100) oriented silicon wafers), $t_s$ and $t_f$ represent the thickness of substrate 104 and inorganic layer 106, respectively. $R_0$ and $R_1$ are the curvature radii before and after deposition of inorganic layer 106. Inorganic layer 106 comprises silicon nitride deposited in a single step in plot 802. Inorganic layer 106 comprises silicon nitride deposited in a split process in plot 804. In some embodiments, the split process comprises alternate deposition steps of 100 nm (equivalent to a process time of 47.0 seconds) followed by a cooling step of 60 seconds. Inorganic layer 106 comprises silicon carbonitride deposited in a single step in plot 806. Both silicon nitride and silicon carbonitride films exhibit a compressive stress level, which becomes more moderate as the thickness of inorganic layer 106 increases. Residual compressive stress level means that the deposition process produces a dense and compressed film, which in turn tends to expand for relaxing its internal energy. A stabilization is observed when the film thickness exceeds 1.0 µm. In the case of silicon nitride, a plateau is reached at −65±5 MPa, whereas the stress of silicon carbonitride films levels off around −280±20 MPa.

Figure 9:
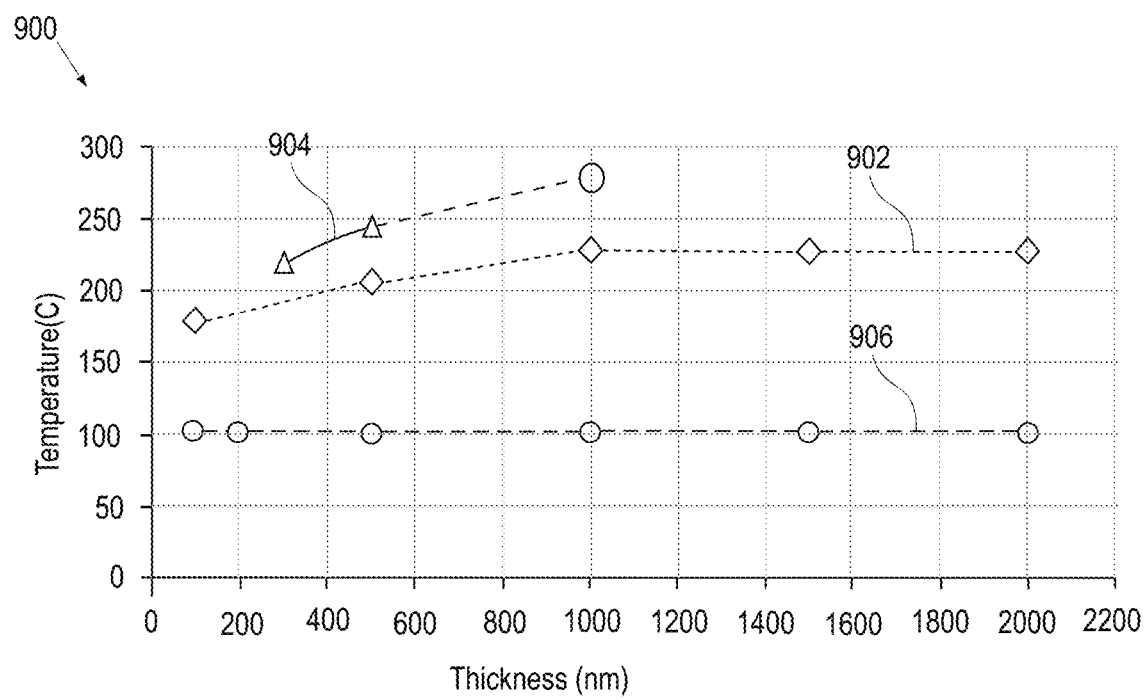
FIG. 9 is a graph representing peak wafer temperature as a function of inorganic layer thickness according to some embodiments of the present disclosure.

FIG. 9 is a graph 900 representing peak wafer temperature during deposition of inorganic layer 106 as a function of inorganic layer thickness according to some embodiments of the present disclosure. Prior to deposition of inorganic layer 106, substrate 104 may be pre-treated with degas and soft-etching process, which can result in a peak temperature of approximately 150 degrees Celsius. The peak temperature post deposition shows an increase to approximately 180 degrees Celsius for the 100 nm silicon nitride layer, up to approximately 270 degrees Celsius for the 500 nm layer and then a stabilization to approximately 228 degrees Celsius for all other thicker films as represented by plot 902. This behavior indicates the effectiveness of the deposition and cooling regime adopted to stabilize the peak temperature. Silicon nitride deposition of 300 nm and 500 nm runs in a single step without cooling reaches approximately 40 to 50 degrees higher temperature as represented by plot 904, and the 1.0 micrometer process exceeded the upper range of 260 degrees Celsius as shown by the dotted extended line. Silicon carbonitride processes (e.g., inorganic layer 106 comprising silicon carbonitride) indicate a stable temperature of approximately 100 degrees Celsius, independent of the film thickness, as indicated by plot 906.

In various embodiments, any of the features discussed with reference to any of FIGS. 1-7B herein may be combined with any other features to form a package with one or more ICs as described herein, for example, to form a modified IC package 100. Some such combinations are described above, but, in various embodiments, further combinations and modifications are possible.

Example Methods

Figure 10:
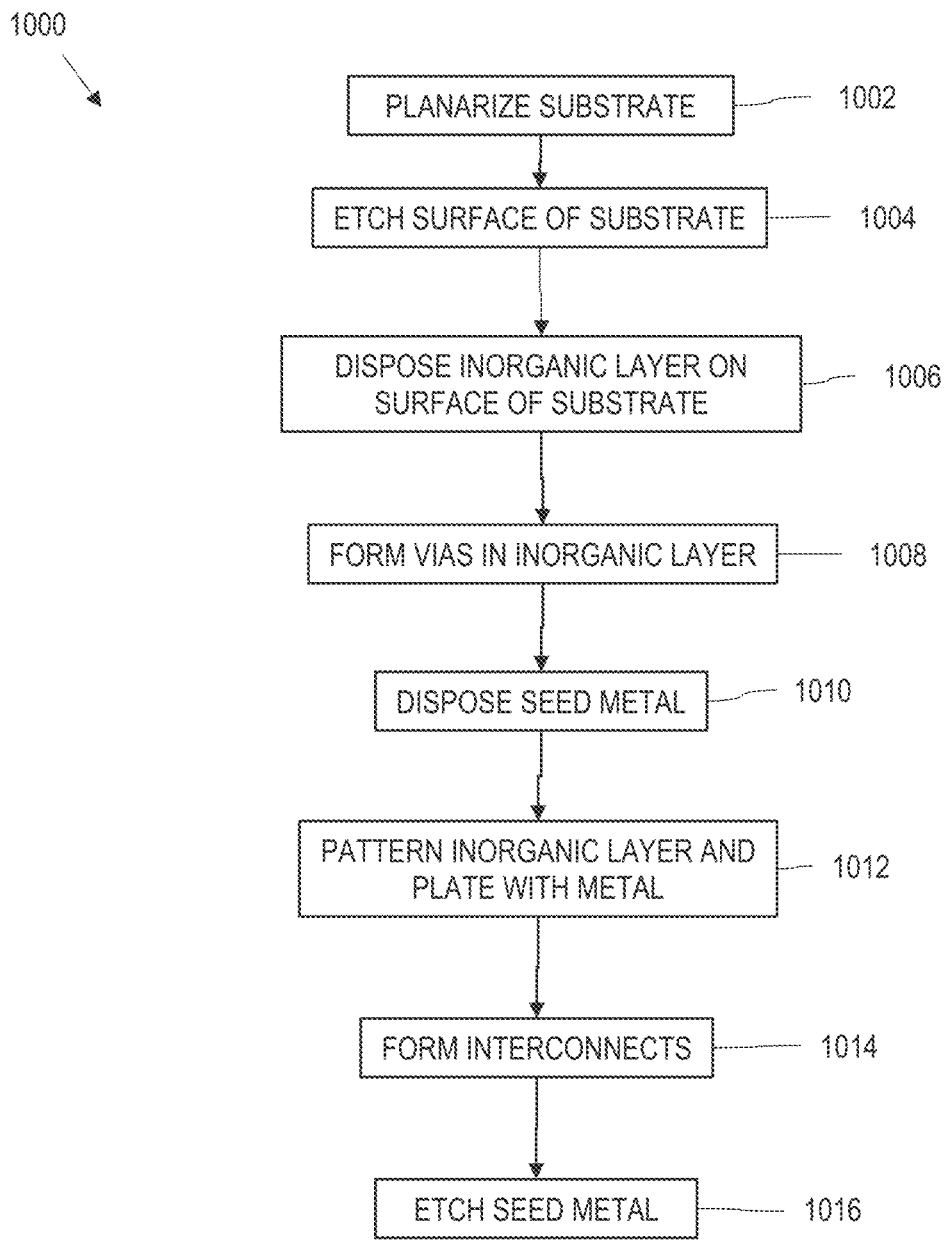
FIG. 10 is a flow diagram of an example method of fabricating the IC package according to various embodiments of the present disclosure.

FIG. 10 is a flow diagram of an example method 1000 of fabricating an IC package 100, according to various embodiments of the present disclosure. Although FIG. 10 illustrates various operations performed in a particular order, this is simply illustrative, and the operations discussed herein may be reordered and/or repeated as suitable. Further, additional processes which are not illustrated may also be performed without departing from the scope of the present disclosure. Also, various ones of the operations discussed herein with respect to FIG. 10 may be modified in accordance with the present disclosure to fabricate others of microelectronic assembly 200 disclosed herein.

At 1002, substrate 104 may be planarized, for example, using a chemical mechanical polishing (CMP) process. At 1004, surface 108 of substrate 104 may be subjected to a soft-etching process, for example ICP etching, to enable a slight (e.g., 10%) increase in surface roughness. The soft-etching process may be preceded in some embodiments (or combined in others) by a degas process. Degas is primarily applied to eliminate surface moisture from organic substrate 104 by heating the wafer typically up to 120-150° C. The subsequent soft-etching may take place in a dedicated chamber, such as an ICP module, in which bombardment of substrate 104 by low-energy and high-density Argon plasma can efficiently eliminate surface contamination and native oxides, in addition to increasing surface roughness, thereby enhancing adhesion of the subsequent inorganic layer 106.

At 1006, inorganic layer 106 may be disposed on surface 108. In various embodiments, a low temperature PVD process using magnetron sputtering may be used to generate a layer thickness of around 1.5 micrometer to 2 micrometer. The main benefits of magnetron sputtering include high deposition rates, excellent thickness uniformity, tight defect control and low deposition temperatures compared to chemical vapor deposition (CVD) and PECVD counterparts. In various embodiments, amorphous films of silicon nitride (a-$Si_xN_y$) and silicon carbonitride (a-$SiC_xN_y$) may be deposited on bare silicon substrates by direct current (DC) magnetron sputtering in a mixed atmosphere of nitrogen and argon.

In embodiments where silicon nitride is the material of inorganic layer 106, the main hardware features of the process modules, as well as the key process conditions are as follows. A polycrystalline silicon target with 400 mm diameter may be used to sputter silicon nitride in a PVD tool. In some embodiments, the PVD tool may comprise a high-volume manufacturing tool configured for 300 mm wafer size and dedicated to well-established backside metallization (BSM) processes. In some embodiments the PVD tool for silicon nitride deposition may use "recessed chucks" to prevent direct contact between the non-deposited wafer side and the chuck surface. In the recessed setup, only the wafer circumference rests on a metal supporting ring located around the chuck top. The additional requirement for full face deposition in BSM applications may forbid any mechanical fixation of the substrate edge. Thus, with the recessed chuck, the substrate can only dissipate heat generated by the inorganic layer growth through radiation. To favor such heat dissipation (e.g., so that the increase of temperature during deposition is limited), a "split process" comprising alternating deposition steps with cooling steps may be performed in some embodiments.

The deposition conditions of the silicon nitride best-known method (BKM), such as power density, $N_2$:Ar gas ratio and process pressure are as follows: power source with pulsed DC at a frequency of 350 kHz and pulse off-time of 1100 nanosecond; power density of 6.37 W/cm$^2$; gas ratio of nitrogen ($N_2$) to Argon (Ar) of 1; sputtering pressure (pump throttled) at $1.3e^{-2}$ mbar. Of these process parameters, two important tuning knobs to reduce the stress of silicon nitride films includes use of DC power in pulsed mode, in combination with increased process pressure obtained by operating the pump in throttled mode.

In embodiments using silicon carbonitride as material for inorganic layer 106, a 200 mm wafer size PVD tool may be used, for example, equipped with a 300 mm diameter powder pressed silicon carbide target, with a 1:1 silicon/carbon ratio. The process conditions of the established silicon carbonitride BKM are as follows: continuous DC power source; 4.95 W/cm$^2$ power density; 1.2 gas ratio of $N_2$:Ar; and $9.7e^{-4}$ mbar sputtering pressure. In various embodiments, multi-chamber PVD tools configurable with up to six process modules clustered around a central vacuum transport section may be used. Such multi-chamber architecture can allow execution of a sequence of processes in different modules without breaking vacuum. Also, for deposited inorganic layers thicker than 1.0 μm, the use of more than one PVD chamber helps to multiply the achievable run-rate by a factor proportional to the number of chambers used. In some embodiments, the PVD tool used to deposit silicon carbonitride may be equipped with a clamping setup to mechanically fix the wafer edge by the mass of the clamping mask. As a result, the entire non-deposition wafer surface may be in contact with a water-cooled pedestal. Argon gas applied through a dedicated inlet at the center of the chuck may be distributed by a network of grooves provides efficient wafer cooling by conduction.

At 1008, vias may be formed in inorganic layer 106 using any suitable process, such as laser cutting or etching. In some embodiments, the vias may be of size 4 μm×6 μm. At 1010, a seed metal (e.g., titanium or copper) may be deposited on surface 116 of inorganic layer 106. In some embodiments, surface 116 may be etched to improve adhesion of the seed metal. At 1012, surface 116 of inorganic layer may be patterned and plated with metal to form conductive traces 118. In some embodiments, more than one layer of metal may be plated. For example, copper may be plated across the entire seed metal, followed by nickel (Ni) at select locations (e.g., bond pads), followed by an alloy of tin (Sn) and silver (Ag) on the nickel. In some embodiments using solder as the interconnect, solder may also be plated on the bond pads. At 1014, interconnects (e.g., 118B) may be formed, for example, to couple substrate 104 with other components of IC package 100. At 1016, the seed metal may be etched away. The resulting structure may be similar to the structure disclosed with regard to FIG. 1.

Figure 11:
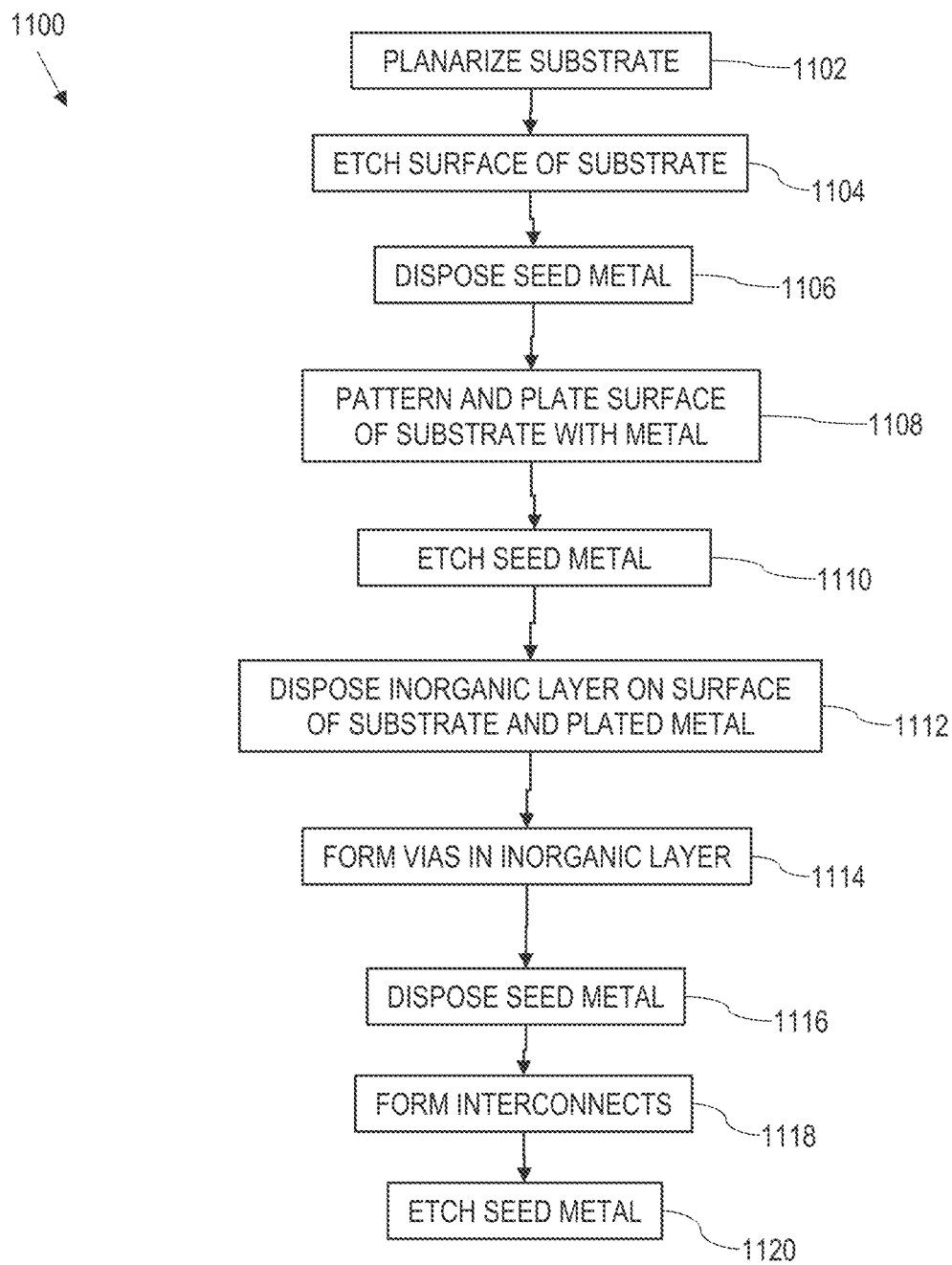
FIG. 11 is a flow diagram of another example method of fabricating the IC package, according to various embodiments of the present disclosure.

FIG. 11 is a flow diagram of an example method 1100 of fabricating an IC package 100, according to various embodiments of the present disclosure. At 1102, substrate 104 may be planarized, for example, using a CMP process. At 1104, surface 108 of substrate 104 may be subjected to a soft-etching process, for example ICP etching, to enable a slight (e.g., 10%) increase in surface roughness. The soft-etching process may be preceded in some embodiments (or combined in others) by a degas process. At 1106, seed metal (e.g., titanium or copper) may be disposed on surface 108 of substrate 104. At 1108, surface 108 may be patterned and plated with metal, such as copper, to generate bond pads 202 and a portion of conductive traces 118, for example, 118A. In some embodiments, the minimum pitch for the plated metal may be 25 μm. At 1110, seed metal may be etched away.

At 1112, inorganic layer 106 may be disposed on surface 108, and on the plated metal (e.g., bond pads 202 and portion of conductive traces 118A). The process for disposing inorganic layer 106 may be the same as disclosed with regard to FIG. 10. The resulting thickness of inorganic layer 106 may be 3-5 μm in some embodiments. At 1114, vias may be formed in inorganic layer 106, for example, by laser cutting or etching. At 1116, a seed metal (e.g., titanium or copper) may be deposited on surface 116 of inorganic layer 106. In some embodiments, surface 116 may be etched to improve adhesion of the seed metal. At 1118, interconnects (e.g., 118B) may be formed, for example, by further pattern and plating of metal on surface 116. At 1120, the seed metal deposited on surface 116 may be etched away. The resulting structure may be similar to the structure disclosed with regard to FIG. 2.

Figure 12:
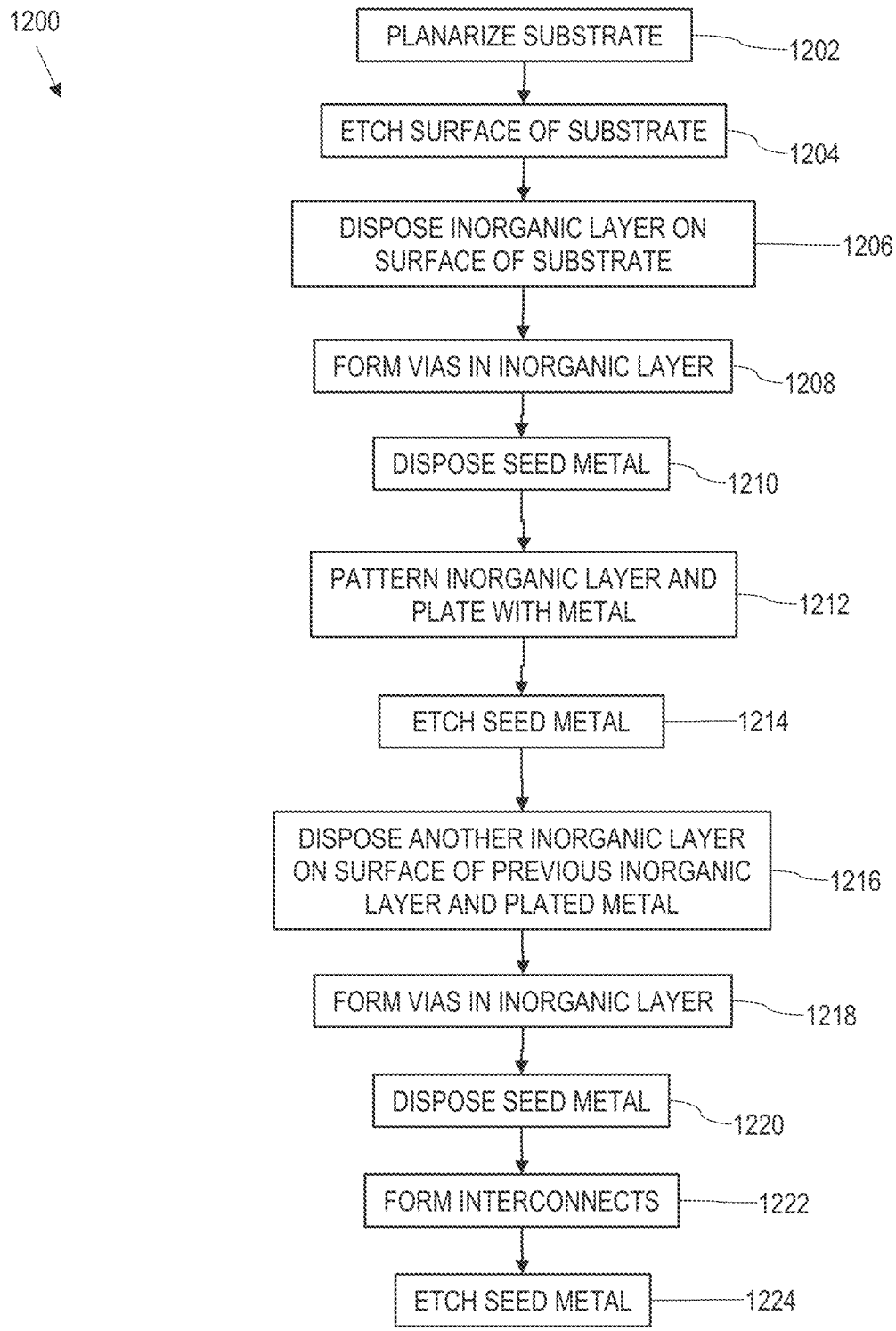
FIG. 12 is a flow diagram of yet another example method of fabricating the IC package, according to various embodiments of the present disclosure.

FIG. 12 is a flow diagram of an example method 1200 of fabricating an IC package 100, according to various embodiments of the present disclosure. At 1202, substrate 104 may be planarized, for example, using a CMP process. At 1204, surface 108 of substrate 104 may be subjected to a soft-etching process, for example ICP etching, to enable a slight (e.g., 10%) increase in surface roughness. The soft-etching process may be preceded in some embodiments (or combined in others) by a degas process. At 1206, inorganic layer 106(1) may be disposed on surface 108. The process for disposing inorganic layer 106(1) may be the same as disclosed with regard to FIG. 10. The resulting thickness of inorganic layer 106(1) may be 1.5-2 μm in some embodiments. At 1208, vias may be formed in inorganic layer 106(1), for example, by laser cutting or etching.

At 1210, seed metal (e.g., titanium or copper) may be disposed on surface 116(1) of inorganic layer 106(1). At 1212, surface 116(1) may be patterned and plated with metal, such as copper, to generate bond pads 202 and a portion of conductive traces 118, for example, 118A. In some embodiments, the minimum pitch for the plated metal may be 25 μm. At 1214, the seed metal deposited on surface 116(1) may be etched away.

At 1216, another inorganic layer 106(2) may be disposed on surface 116(1) of the previously laid inorganic layer 106(1), and on the plated metal (e.g., bond pads 202 and portion of conductive traces 118A). The process for disposing inorganic layer 106(2) may be the same as for inorganic layer 106(1). The resulting thickness of inorganic layer 106(2) may be 3-5 μm in some embodiments. At 1218, vias may be formed in inorganic layer 106(2), for example, by laser cutting or etching. At 1220, a seed metal (e.g., titanium or copper) may be deposited on surface 116(2) of inorganic layer 106(2). In some embodiments, surface 116(2) may be etched to improve adhesion of the seed metal. At 1222, interconnects (e.g., 118B) may be formed, for example, by further pattern and plating of metal on surface 116(2). At 1224, the seed metal deposited on surface 116(2) may be etched away. The resulting structure may be similar to the structure disclosed with regard to FIG. 3.

Although the operations of methods 1000, 1100 and 1200 are illustrated in FIGS. 10-12 once each and in a particular order, the operations may be performed in any suitable order and repeated as desired. For example, one or more operations may be performed in parallel to manufacture multiple IC packages substantially simultaneously. In another example, the operations may be performed in a different order to reflect the structure of a particular IC package in which one or more IC package 100 as described herein may be included. Numerous other variations are also possible to achieve the desired structure of IC package 100.

Furthermore, the operations illustrated in FIGS. 10-12 may be combined or may include more details than described. Still further, methods 1000, 1100 and 1200 shown in FIGS. 10-12 may further include other manufacturing operations related to fabrication of other components of the assemblies described herein, or any devices that may include assemblies as described herein. For example, methods 1000, 1100 and 1200 may include various cleaning operations, surface planarization operations (e.g., using CMP), operations for surface roughening, operations to include barrier and/or adhesion layers as desired, and/or operations for incorporating packages as described herein in, or with, an IC component, a computing device, or any desired structure or device.

Example Devices and Components

Figure 13:
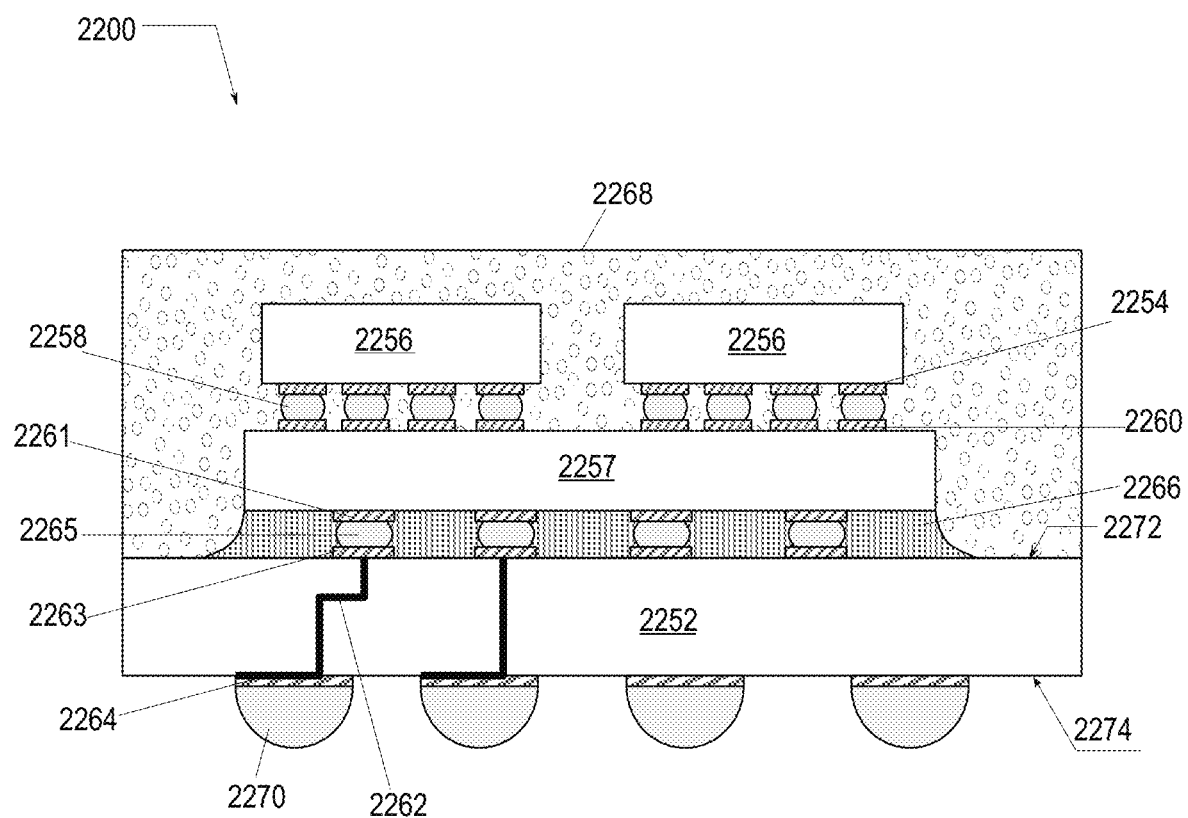
FIG. 13 is a cross-sectional view of a device package that may include one or more IC packages in accordance with any of the embodiments disclosed herein.
Figure 14:
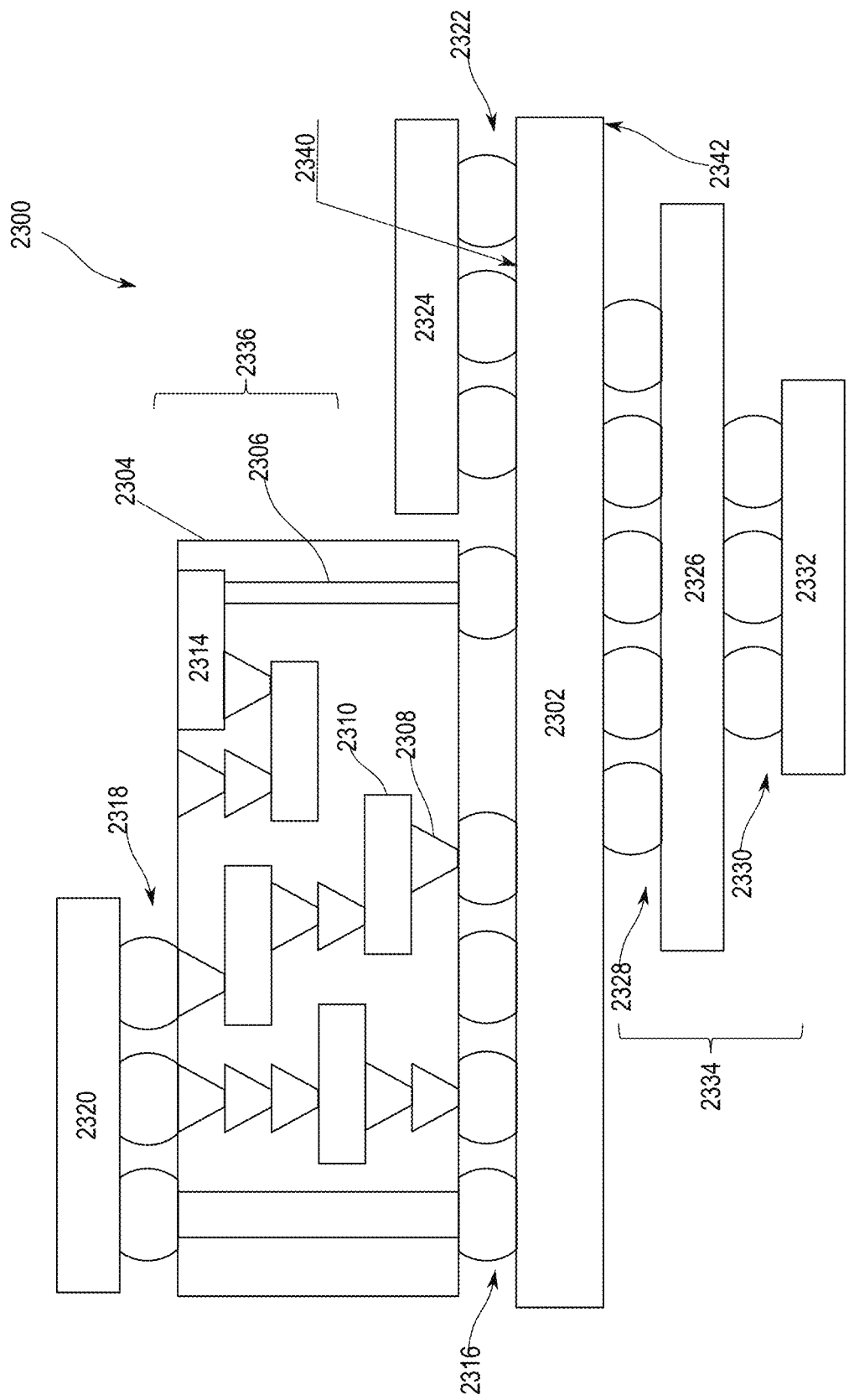
FIG. 14 is a cross-sectional side view of a device assembly that may include one or more IC packages in accordance with any of the embodiments disclosed herein.
Figure 15:
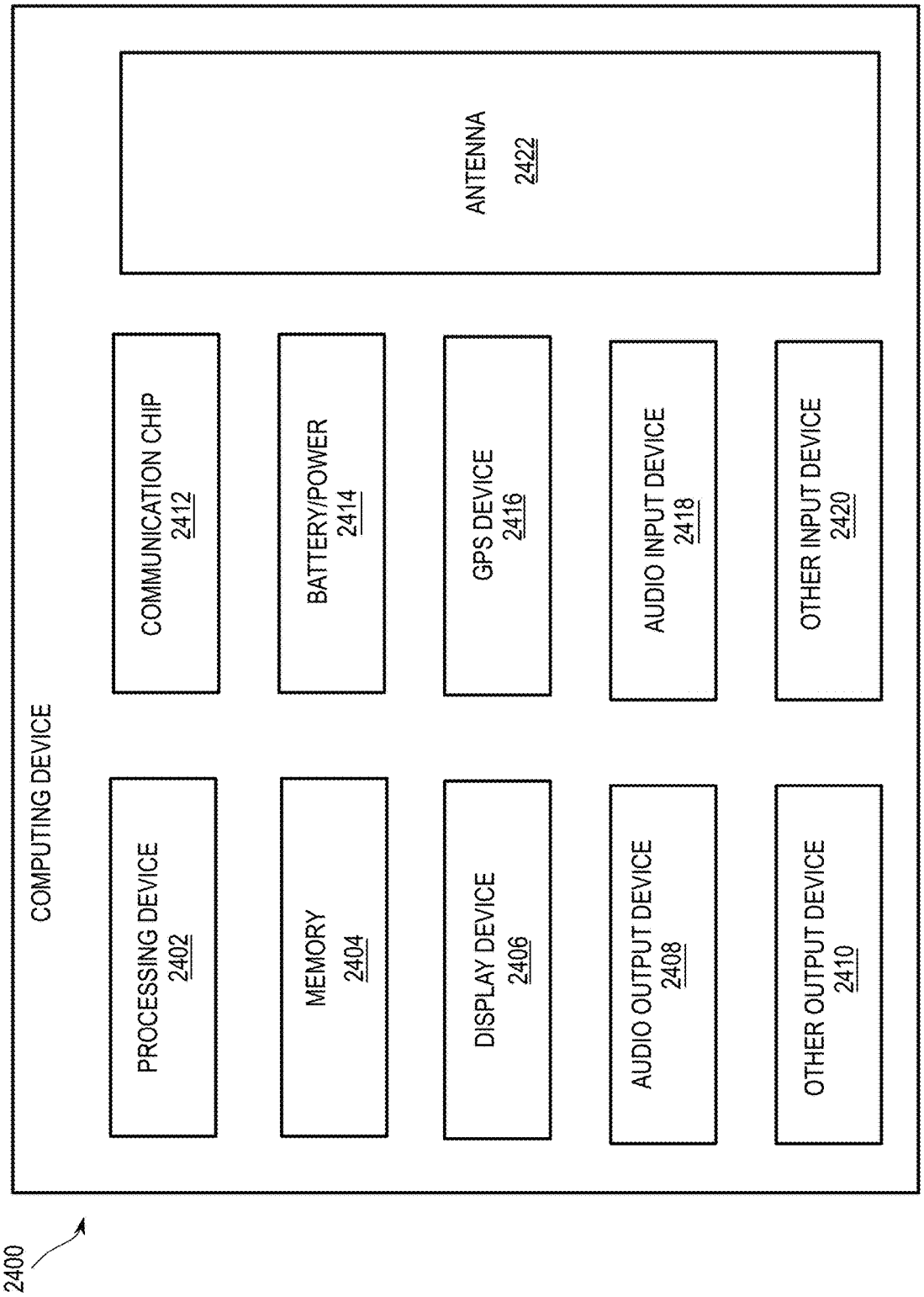
FIG. 15 is a block diagram of an example computing device that may include one or more IC packages in accordance with any of the embodiments disclosed herein.

The packages disclosed herein, e.g., any of the embodiments shown in FIGS. 1-7 or any further embodiments described herein, may be included in any suitable electronic component. FIGS. 13-15 illustrate various examples of packages, assemblies, and devices that may be used with or include any of the IC packages as disclosed herein.

FIG. 13 is a side, cross-sectional view of an example IC package 2200 that may include IC packages in accordance with any of the embodiments disclosed herein. In some embodiments, the IC package 2200 may be a system-in-package (SiP).

As shown in FIG. 13, package support 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias, e.g., as discussed above with reference to FIG. 1.

Package support 2252 may include conductive contacts 2263 that are coupled to conductive pathway 2262 through package support 2252, allowing circuitry within dies 2256 and/or interposer 2257 to electrically couple to various ones of conductive contacts 2264 (or to other devices included in package support 2252, not shown).

IC package 2200 may include interposer 2257 coupled to package support 2252 via conductive contacts 2261 of interposer 2257, first-level interconnects 2265, and conductive contacts 2263 of package support 2252. First-level interconnects 2265 illustrated in FIG. 13 are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in FIG. 13 are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package support 2252 and interposer 2257 around first-level interconnects 2265, and mold 2268 may be disposed around dies 2256 and interposer 2257 and in contact with package support 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in FIG. 13 are solder balls (e.g., for a BGA arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 14.

In various embodiments, any of dies 2256 may include die 102 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being die 102 as described herein, one or more of dies 2256 may be logic dies (e.g., silicon-based dies), one or more of dies 2256 may be memory dies (e.g., high bandwidth memory), etc. In some embodiments, at least some of dies 2256 may include inorganic layer 106 as described herein. In some embodiments, at least some of dies 2256 may not include inorganic layer 106 as described herein.

Although IC package 2200 illustrated in FIG. 13 is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package support 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 14 is a cross-sectional side view of an IC device assembly 2300 that may include components having one or more microelectronic assembly 200 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 200 in accordance with any of the embodiments disclosed herein; e.g., any of the IC packages discussed below with reference to IC device assembly 2300 may take the form of any of the embodiments of IC package 2200 discussed above with reference to FIG. 13.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package support.

FIG. 14 illustrates that, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 13. In some embodiments, IC package 2320 may include at least one inorganic layer 106 over organic substrate 104 as described herein. Inorganic layer 106 is not specifically shown in FIG. 14 in order to not clutter the drawing.

Although a single IC package 2320 is shown in FIG. 14, multiple IC packages may be coupled to interposer 2304; indeed, additional interposers may be coupled to interposer 2304. Interposer 2304 may provide an intervening package support used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in FIG. 14, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 15 is a block diagram of an example computing device 2400 that may include one or more components having one or more IC packages in accordance with any of the embodiments disclosed herein. For example, any suitable ones of the components of computing device 2400 may include inorganic layer 106 over organic substrate 104, in accordance with any of the embodiments disclosed herein. In another example, any one or more of the components of computing device 2400 may include any embodiments of IC package 2200 (e.g., as shown in FIG. 13). In yet another example, any one or more of the components of computing device 2400 may include an IC device assembly 2300 (e.g., as shown in FIG. 14).

A number of components are illustrated in FIG. 15 as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-a-chip (SoC) die.

Additionally, in various embodiments, computing device 2400 may not include one or more of the components illustrated in FIG. 15, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-M RAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides an interposer (e.g., 101), comprising an organic substrate (e.g., 104) comprising a first set of interconnects (e.g., 110) of a first pitch (e.g., 602), an inorganic layer (e.g., 106) comprising a second set of interconnects (e.g., 604) of a second pitch (e.g., 606), and conductive traces (e.g., 118) electrically coupling the first set of interconnects with the second set of interconnects. The inorganic layer is over the organic substrate (e.g., FIGS. 1-6), and the second pitch is different from the first pitch (e.g., FIG. 6A).

Example 2 provides the interposer of example 1, in which a surface of the organic substrate proximate to the inorganic layer is subjected to a soft-etching process prior to disposing the inorganic layer (e.g., FIGS. 10-12).

Example 3 provides the interposer of any of examples 1-2, in which the second set of interconnects and the conductive traces are over the inorganic layer (e.g., FIG. 6B).

Example 4 provides the interposer of any of examples 1-2, in which the second set of interconnects and the conductive traces are within the inorganic layer (e.g., FIG. 2).

Example 5 provides the interposer of any of examples 1-2, in which the second set of interconnects (e.g., 114) are within the inorganic layer and the conductive traces are over the inorganic layer (e.g., FIG. 1).

Example 6 provides the interposer of any of examples 1-5, in which the second pitch is smaller than the first pitch.

Example 7 provides the interposer of any of examples 1-5, in which the second pitch is larger than the first pitch.

Example 8 provides the interposer of any of examples 1-7, in which the first set of interconnects comprises through-connections (e.g., 110B) extending between a surface (e.g., 108) of the substrate proximate to the inorganic layer and an opposing surface (e.g., 112) of the substrate.

Example 9 provides the interposer of any of examples 1-8, further comprising a die (e.g., 102 in FIG. 1) embedded in the substrate.

Example 10 provides the interposer of example 9, in which the die comprises active circuitry.

Example 11 provides the interposer of example 9, in which the die comprises only passive circuitry without any active components.

Example 12 provides the interposer of any of examples 9-11, in which the first set of interconnects comprises through-connections (e.g., 110A) extending between the surface and the die.

Example 13 provides the interposer of any of examples 1-8, in which the inorganic layer is over a first surface (e.g., 108) of the substrate, a second surface (e.g., 112) of the substrate opposite to the first surface comprises a third set of interconnects (e.g., 506) having a third pitch, and the third pitch is different from the first pitch (e.g., FIGS. 5A-5B).

Example 14 provide the interposer of example 13, in which the inorganic layer comprises a first inorganic layer (e.g., 106(1)), and the interposer further comprises a second inorganic layer (e.g., 106(2)) over the second surface of the substrate (e.g., FIG. 5B).

Example 15 provides the interposer of example 14, further comprising conductive traces coupled to the second inorganic layer electrically coupling the first set of interconnects with the third set of interconnects.

Example 16 provides the interposer of any of examples 13-15, in which the third pitch is larger than the first pitch.

Example 17 provides the interposer of any of examples 1-16, in which the inorganic layer provides a protective barrier over the organic substrate.

Example 18 provides the interposer of any of examples 1-17, in which the inorganic layer is a first inorganic layer (e.g., 106(1)), and the interposer comprises a second inorganic layer (e.g., 106(2)) over the first inorganic layer (e.g., FIG. 3).

Example 19 provides the interposer of example 18, in which the conductive traces (e.g., 118A) are within the second inorganic layer.

Example 20 provides the interposer of any of examples 18-19, in which the second inorganic layer comprises a third set of interconnects (e.g., 114(2)) coupled to the second set of interconnects (e.g., 114(1)), and the conductive traces (e.g., 118B) are over the second inorganic layer.

Example 21 provides the interposer of any of examples 1-20, further comprising an organic layer (e.g., 406 in FIG. 4) over the inorganic layer such that the inorganic layer is between the organic layer and the organic substrate.

Example 22 provides the interposer of example 21, in which the organic layer comprises a third set of interconnects of a third pitch.

Example 23 provides the interposer of example 21, in which the organic layer comprises polyimide.

Example 24 provides the interposer of any of examples 1-23, in which the inorganic layer comprises silicon nitride or silicon carbonitride.

Example 25 provides an IC package comprising a die (e.g., 102A or 102B in FIG. 5B) having a first set of interconnects (e.g., 510, 512, or 514) of a first pitch, and an interposer (e.g., 101) comprising an organic substrate (e.g., 104) having a second set of interconnects (e.g., 110A, 110B) of a second pitch, and an inorganic layer (e.g., 106(1)) over the organic substrate. The inorganic layer comprises conductive traces (e.g., 118(1)) electrically coupling the second set of interconnects with the first set of interconnects, and the die is attached to the interposer by the first set of interconnects.

Example 26 provides the IC package of example 25, further comprising: a package support (e.g., 504) having a third set of interconnects (e.g., 506) of a third pitch, and another inorganic layer (e.g., 106(2)) over a surface (e.g., 112) of the interposer opposite to the die. The another inorganic layer comprises conductive traces (e.g., 118(2)) electrically coupling the third set of interconnects with the second set of interconnects.

Example 27 provides the IC package of any of examples 25-26, further comprising another die (e.g., 102C) embedded in the substrate. A third set of interconnects (e.g., 110A) in the substrate electrically couples the die (e.g., 1026) to the another die.

Example 28 provides the IC package of any of examples 25-27, in which the inorganic layer comprises a RDL.

Example 29 provides the IC package of any of examples 25-27, in which the inorganic layer comprises a capping layer.

Example 30 provides the IC package of any of examples 25-29, in which the inorganic layer is a first inorganic layer (e.g., 106(1)), and the interposer comprises a second inorganic layer (e.g., 106(2)) over the first inorganic layer (e.g., FIG. 3).

Example 31 provides the IC package of any of examples 25-30, further comprising a plurality of dies coupled to the interposer with interconnects of differing pitches (e.g., FIG. 5A). The conductive traces in the inorganic layer electrically couple the interconnects of differing pitches with the second set of interconnects.

Example 32 provides the IC package of any of examples 25-31, in which the first set of interconnects comprises die-to-die (DTD) interconnects.

Example 33 provides the IC package of any of examples 25-31, in which the first pitch is smaller than the second pitch, and the third pitch is larger than the second pitch.

Example 34 provides the IC package of example 26, in which the third set of interconnects comprises die-to-package substrate (DTPS) interconnects.

Example 35 provides a method (e.g., FIGS. 10-11) for fabricating an interposer, comprising providing a substrate comprising an organic insulator, polishing a surface of the substrate to form a polished surface (e.g., 1002, 1102, 1202), increasing a surface roughness of the polished surface to form a roughened surface by (e.g., 1004, 1104, 1204), and disposing an inorganic layer over the roughened surface (e.g., 1006, 1112, 1206).

Example 36 provides the method of example 35, in which the inorganic layer is disposed using physical vapor deposition (PVD) at temperature less than 250 degrees Celsius.

Example 37 provides the method of any of examples 35-36, in which increasing the surface roughness of the polished surface comprises soft-etching in an inductive coupled plasma (ICP) module.

Example 38 provides the method of any of examples 35-37, in which the polishing comprises chemical mechanical polishing.

Example 39 provides the method of any of examples 35-38, further comprising: forming vias in the inorganic layer (e.g., 1008, 1114, 1208), and patterning and plating the inorganic layer with metal to form conductive traces over the inorganic layer (e.g., 1012, 1118, 1212).

Example 40 provides the method of any of examples 35-39, further comprising patterning and plating the organic layer with metal before disposing the inorganic layer to form conductive traces over the organic substrate by (e.g., 1108).

Example 41 provides the method of any of examples 35-40, further comprising disposing another inorganic layer over the inorganic layer (e.g., 1216).

Example 42 provides the method of example 41, further comprising forming vias in the inorganic layer before disposing the another inorganic layer (e.g., 1208).

Example 43 provides the method of example 41, further comprising forming vias in the another inorganic layer (e.g., 1218).

Example 44 provides the method of any of examples 41-43, further comprising patterning and plating the another inorganic layer with metal to form conductive traces over the another inorganic layer by (e.g., 1222).

Example 45 provides the method of any of examples 35-44, further comprising disposing an organic RDL (e.g., 406) over the inorganic layer.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. An interposer, comprising:
   a first inorganic layer comprising a first set of interconnects of a first pitch;
   an organic substrate over the first inorganic layer, the organic substrate comprising a set of vias coupled to the first set of interconnects and arranged at the first pitch;
   a die embedded in the organic substrate;
   a second inorganic layer comprising a second set of interconnects of a second pitch; and
   conductive traces electrically coupling the set of vias with the second set of interconnects, wherein the second pitch is different from the first pitch.

2. The interposer of claim 1, wherein a surface of the organic substrate proximate to the second inorganic layer is subjected to a soft-etching process prior to disposing the second inorganic layer.

3. The interposer of claim 1, wherein the interposer further comprises a third inorganic layer over the second inorganic layer.

4. The interposer of claim 1, wherein the second set of interconnects and the conductive traces are over the organic substrate.

5. The interposer of claim 1, wherein the second set of interconnects and the conductive traces are within the second inorganic layer.

6. The interposer of claim 1, wherein the set of vias comprises through-connections extending between a surface of the organic substrate proximate to the first inorganic layer and an opposing surface of the organic substrate.

7. The interposer of claim 1, wherein the first set of interconnects comprises through-connections extending between a surface of the organic substrate and the die.

8. The interposer of claim 1, further comprising an organic layer over the second inorganic layer such that the second inorganic layer is between the organic substrate and the organic layer.

9. An integrated circuit (IC) package, comprising:
   a die having a first set of interconnects of a first pitch; and
   an interposer comprising a first inorganic layer having a second set of interconnects of a second pitch, an organic substrate over the first inorganic layer, and a second inorganic layer over the organic substrate, wherein:
   the second inorganic layer comprises conductive traces electrically coupling the organic substrate with the first set of interconnects, and
   the die is attached to the interposer by the first set of interconnects.

10. The IC package of claim 9, further comprising:
    a package support having a third set of interconnects of a third pitch, the package support coupled to the first inorganic layer.

11. The IC package of claim 9, further comprising:
    another die embedded in the organic substrate, wherein a third set of interconnects in the organic substrate electrically couples the die to the another die.

12. The IC package of claim 9, wherein the interposer comprises a third inorganic layer over the second inorganic layer.

13. The IC package of claim 9, further comprising a plurality of dies coupled to the interposer with interconnects of differing pitches, wherein the conductive traces in the second inorganic layer electrically couple the interconnects of differing pitches with the second set of interconnects.

14. The interposer of claim 1, the organic substrate further comprising a second set of vias coupled to the die embedded in the organic substrate.

15. The interposer of claim 1, wherein the second set of vias are arranged at the second pitch, and one of the second set of vias is coupled to one of the second set of interconnects.

16. A package comprising:
 a first inorganic layer comprising a first set of interconnects of a first pitch;
 an organic substrate over the first inorganic layer, the organic substrate comprising a set of vias coupled to the first set of interconnects and arranged at the first pitch;
 a die embedded in the organic substrate;
 a second inorganic layer comprising a second set of interconnects of a second pitch; and
 conductive traces electrically coupling the set of vias with the second set of interconnects, wherein the second pitch is different from the first pitch.

17. The package of claim 16, wherein a surface of the organic substrate proximate to the second inorganic layer is subjected to a soft-etching process prior to disposing the second inorganic layer.

18. The package of claim 16, wherein the second set of interconnects and the conductive traces are within the second inorganic layer.

19. The package of claim 16, wherein the set of vias comprises through-connections extending between a surface of the organic substrate proximate to the first inorganic layer and an opposing surface of the organic substrate.

20. The package of claim 16, the organic substrate further comprising a second set of vias coupled to the die embedded in the organic substrate, wherein one of the second set of vias is coupled to one of the second set of interconnects.

* * * * *